US011081569B2

(12) United States Patent
Balakrishnan et al.

(10) Patent No.: US 11,081,569 B2
(45) Date of Patent: Aug. 3, 2021

(54) RESISTOR LOADED INVERTER STRUCTURES

(71) Applicant: INTERNATIONAL BUSINESS MACHINES CORPORATION, Armonk, NY (US)

(72) Inventors: Karthik Balakrishnan, White Plains, NY (US); Bahman Hekmatshoartabari, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 15/843,599

(22) Filed: Dec. 15, 2017

(65) Prior Publication Data

US 2019/0189745 A1   Jun. 20, 2019

(51) Int. Cl.
*H01L 29/66* (2006.01)
*H01L 29/423* (2006.01)
*H01L 29/78* (2006.01)
*H01L 29/10* (2006.01)
*H01L 27/06* (2006.01)
(Continued)

(52) U.S. Cl.
CPC ...... *H01L 29/6656* (2013.01); *H01L 27/0629* (2013.01); *H01L 29/1033* (2013.01);
(Continued)

(58) Field of Classification Search
CPC ....... H01L 29/42392; H01L 21/823487; H01L 29/66666; H01L 29/78642; H01L 28/20;
(Continued)

(56) References Cited

U.S. PATENT DOCUMENTS 5,208,172 A * 5/1993 Fitch ............... H01L 21/823487
257/E21.41
6,773,994 B2 * 8/2004 Chittipeddi ..... H01L 21/823885
257/331
(Continued)

OTHER PUBLICATIONS

Sze et al., Physics of Semiconductor Devices, John Wiley & Sons, Inc. 2007, pp. 219-223, 293-297 (Year: 2007).*

*Primary Examiner* — Shih Tsun A Chou
(74) *Attorney, Agent, or Firm* — Tutunjian & Bitetto, P.C.; L. Jeffrey Kelly

(57) ABSTRACT

A method of forming an electrical device is provided that includes a semiconductor device and a passive resistor both integrated in a same vertically orientated epitaxially grown semiconductor material. The vertically orientated epitaxially grown semiconductor material is formed from a semiconductor surface of a supporting substrate. The vertically orientated epitaxially grown semiconductor material includes a resistive portion and a semiconductor portion, in which the sidewalls of the resistive portion are aligned with the sidewalls of the semiconductor portion. A semiconductor device is formed on the semiconductor portion of the vertically orientated epitaxially grown semiconductor material. A passive resistor is present in the resistive portion of the vertically orientated epitaxially grown semiconductor material, the resistive portion having a higher resistance than the semiconductor portion.

6 Claims, 11 Drawing Sheets

(51) Int. Cl.
*H01L 29/808* (2006.01)
*H01L 29/786* (2006.01)
*H01L 49/02* (2006.01)

(52) U.S. Cl.
CPC .... *H01L 29/1066* (2013.01); *H01L 29/42392* (2013.01); *H01L 29/66545* (2013.01); *H01L 29/66553* (2013.01); *H01L 29/66666* (2013.01); *H01L 29/66742* (2013.01); *H01L 29/66795* (2013.01); *H01L 29/785* (2013.01); *H01L 29/7827* (2013.01); *H01L 29/78618* (2013.01); *H01L 29/78642* (2013.01); *H01L 29/8083* (2013.01); *H01L 28/20* (2013.01)

(58) Field of Classification Search
CPC ............. H01L 27/0629; H01L 29/6656; H01L 29/7827; H01L 29/8083; H01L 29/78462
See application file for complete search history.

(56) References Cited

U.S. PATENT DOCUMENTS

| | | | | |
|---|---|---|---|---|
| 9,680,012 | B1* | 6/2017 | Diaz | H01L 29/7827 |
| 9,954,109 | B2* | 4/2018 | Cheng | H01L 21/2252 |
| 2010/0264485 | A1* | 10/2010 | Masuoka | H01L 29/42356 |
| | | | | 257/329 |
| 2011/0233512 | A1* | 9/2011 | Yang | B82Y 10/00 |
| | | | | 257/9 |
| 2012/0319201 | A1* | 12/2012 | Sun | H01L 21/823487 |
| | | | | 257/338 |
| 2013/0153989 | A1* | 6/2013 | Masuoka | H01L 29/0653 |
| | | | | 257/329 |
| 2016/0013284 | A1* | 1/2016 | Masuoka | H01L 29/42392 |
| | | | | 257/372 |
| 2016/0240626 | A1* | 8/2016 | Chang | H01L 29/42392 |
| 2018/0122793 | A1* | 5/2018 | Moroz | H01L 29/4238 |

* cited by examiner

PMOS
NOT gate

NMOS
NOT gate

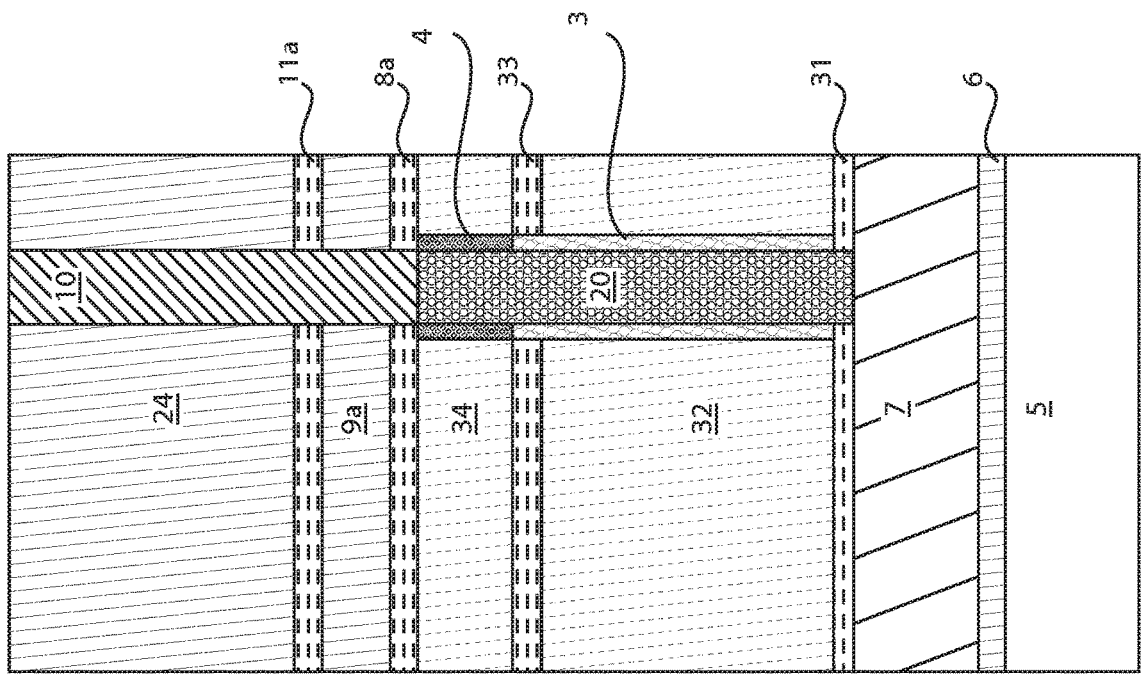
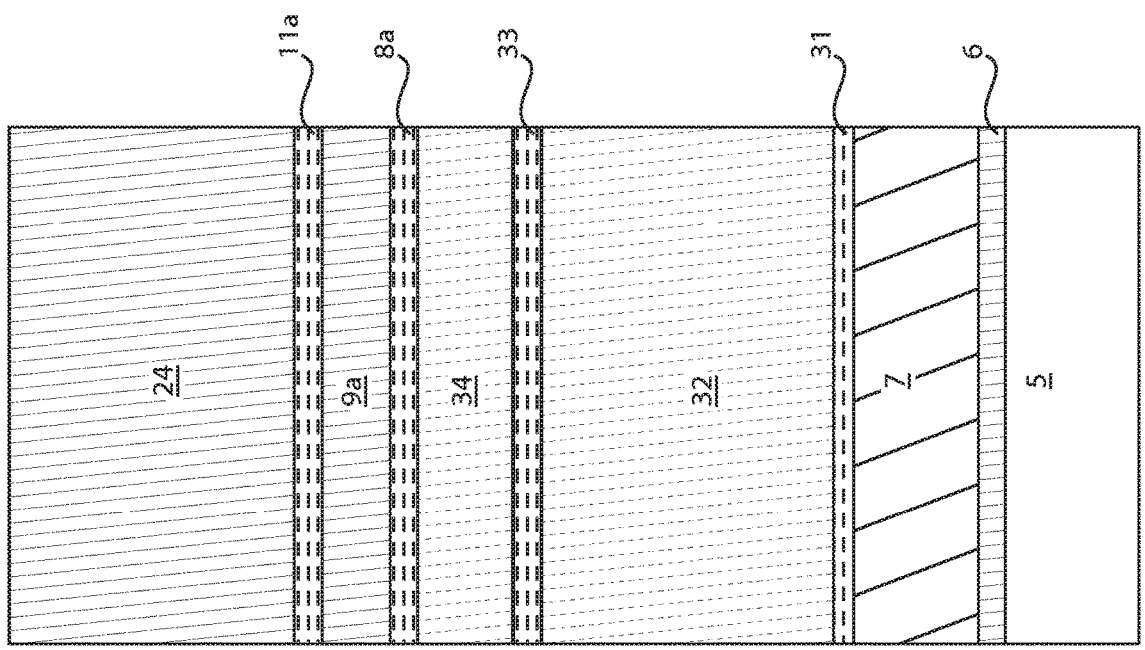

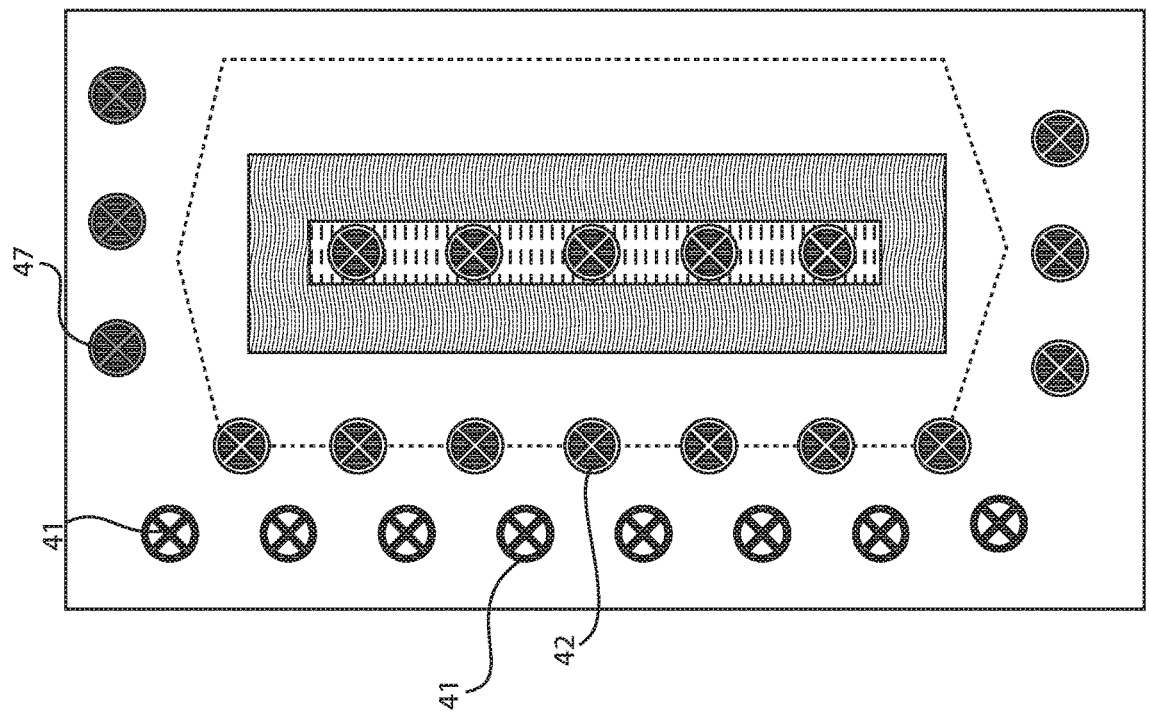
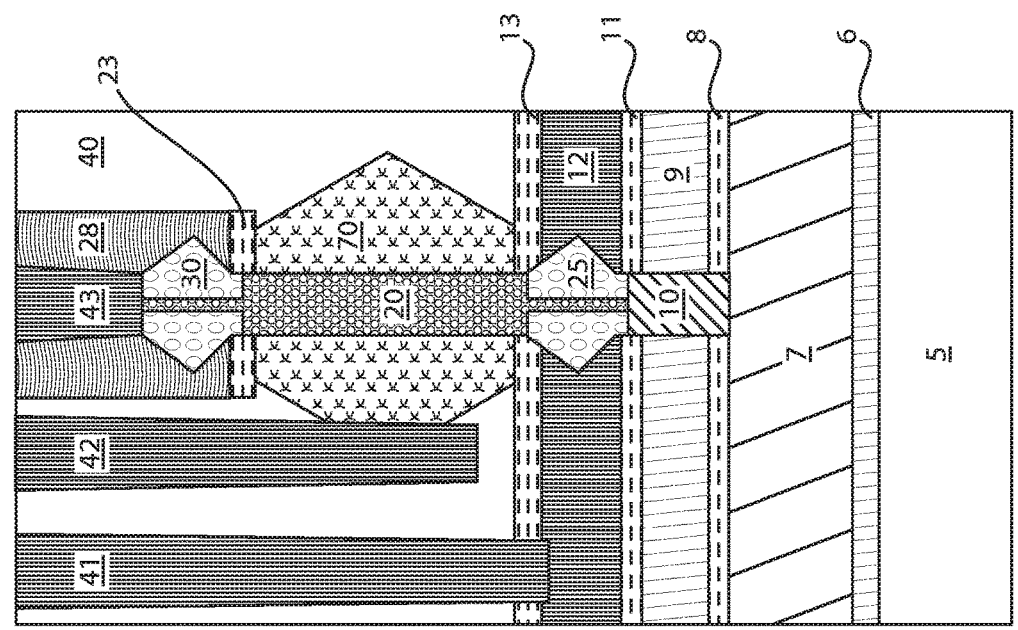
FIG. 19
FIG. 18

RESISTOR LOADED INVERTER STRUCTURES

BACKGROUND

Technical Field

The present invention generally relates to passive electrical devices, and more particularly to integrating passive electrical devices with transistor type electrical devices.

Description of the Related Art

A resistor is an electrical component that limits or regulates the flow of electrical current in an electronic circuit. Resistors can also be used to provide a specific voltage for an active device such as a transistor. All other factors being equal, in a direct-current (DC) circuit, the current through a resistor is inversely proportional to its resistance, and directly proportional to the voltage across it. This is the well-known Ohm's Law.

SUMMARY

In one embodiment, a metal oxide semiconductor field effect transistor and resistor loaded inverter is provided that includes a fin structure vertically orientated on a supporting substrate, in which the fin structure includes a resistive portion and a semiconductor portion. In some embodiments, a transistor including a channel region is present in the semiconductor portion of the fin structure and a gate all around (GAA) gate structure is present on the channel region. The gate all around gate structure includes a gate dielectric directly on the channel region of the semiconductor portion of the fin structure and a gate electrode directly on the gate dielectric. A passive resistor is provided in the resistive portion of the fin structure.

In another embodiment, a junction field effect transistor and resistor loaded inverter is provided that includes a fin structure vertically orientated on a supporting substrate, in which the fin structure includes a resistive portion and a semiconductor portion. In some embodiments, a transistor including a channel region is present in the semiconductor portion of the fin structure and a gate all around (GAA) gate structure is present on the channel region. The gate all around gate structure includes a gate electrode directly on the channel region of the semiconductor portion of the fin structure. A passive resistor is provided in the resistive portion of the fin structure.

In another aspect of the present disclosure, a method of forming an inverter is provided that includes a semiconductor device and a passive resistor both integrated in a same vertically orientated epitaxially grown semiconductor material. The vertically orientated epitaxially grown semiconductor material is formed from a semiconductor surface of a supporting substrate. The vertically orientated epitaxially grown semiconductor material includes a resistive portion and a semiconductor portion, in which the sidewalls of the resistive portion are aligned with the sidewalls of the semiconductor portion. A semiconductor device is formed on the semiconductor portion of the vertically orientated epitaxially grown semiconductor material. The semiconductor device includes a gate structure present on a channel region portion of the semiconductor portion of the vertically orientated epitaxially grown semiconductor material, and source and drain regions on opposing sides of the channel region portion. A passive resistor is present in the resistive portion of the vertically orientated epitaxially grown semiconductor material, the resistive portion having a higher resistance than the semiconductor portion.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 13 is a side cross-sectional view of a material stack that provides an initial structure for use in a method for forming an inverter structure as depicted in FIGS. 10-12.

FIG. 14 is a side cross-sectional view of forming a trench through the material stack depicted in FIG. 13 to expose a surface of a heavily doped epitaxial source layer, and epitaxially forming a fin structure in the opening, in which the heavily doped source layer provides a surface for epitaxial growth.

FIG. 18 is a side cross-sectional view depicting one embodiment of a inverter including a passive electrical device, e.g., a passive resistor, integrated with a junction field effect transistor (JFET) having a vertical orientation, in which the body portion of the passive resistor is positioned between the channel portion of the vertically orientated JFET and a supporting substrate, in accordance with the present disclosure.

FIG. 19 is a top down view of the structure depicted in FIG. 18.

DETAILED DESCRIPTION

Figure 2:
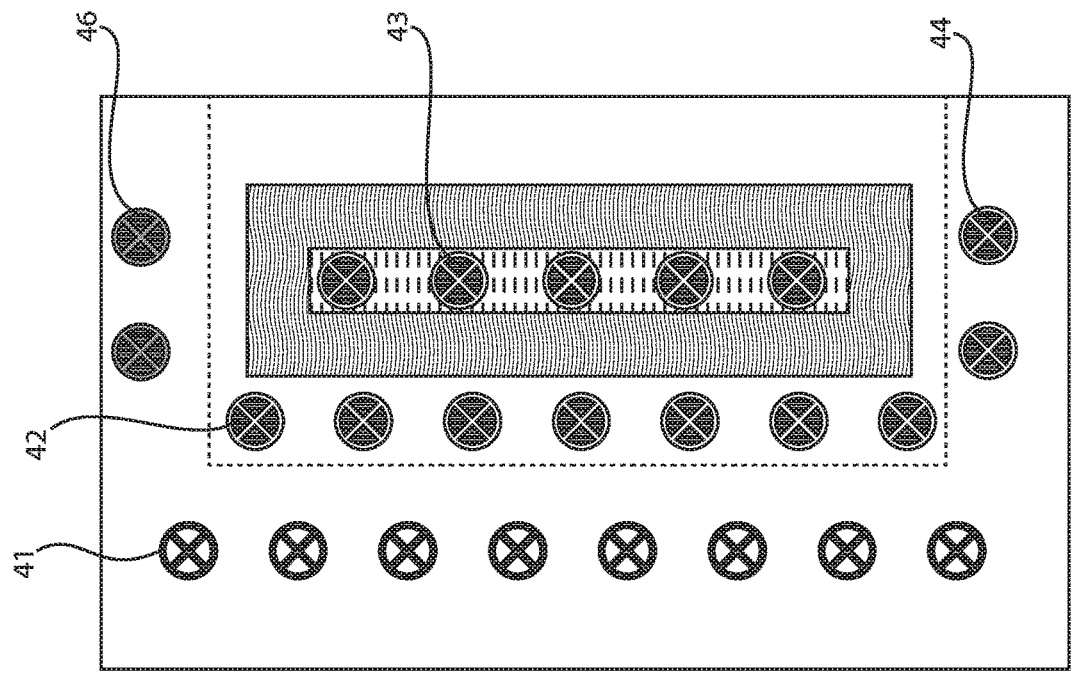
FIG. 2 is a top down view of the structure depicted in FIG. 1.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In the embodiments described herein, the transistors are field effect transistors (FETs). As used herein a "field effect transistor" is a transistor in which output current, i.e., source-drain current, is controlled by the voltage applied to the gate. A field effect transistor has three terminals, i.e., gate, source and drain. A "gate structure" means a structure used to control output current (i.e., flow of carriers in the channel) of a semiconducting device through electrical fields. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel from the source. The field effect transistors of the present disclosure have a vertically orientated channel region that can be present within a fin structure. As used herein, a "fin structure" refers to a semiconductor material, which is employed as the body of a semiconductor device, in which the gate structure is positioned around the fin structure such that charge flows up or down the channel of the fin structure A FinFET is a semiconductor device that positions the channel region of the semiconductor device in a fin structure. As used herein, the term "channel" is the region adjacent to the gate structure and between the source and drain of a semiconductor device that becomes conductive when the semiconductor device is turned on. The source and drain regions of the fin structure are the portions of the fin structure that are on opposing sides of the channel region of the fin structure. A "vertical" FinFET semiconductor device has the drain, fin channel, and source device components arranged perpendicular to the plane of the substrate surface, which is referred to as a vertical stack.

In comparison to active resistors, e.g., diode connected transistors, passive resistors can have a higher temperature stability, higher linearity (i.e., higher bias stability) and lower noise. In some embodiments, passive resistors may be integrated into applications, such as biasing the high gain amplifiers or analog computation units, where small variations in bias may significantly drift the output. One issue associated with monolithic integration of passive resistors is their large area consumption. This is because the passive resistance values are larger or much larger than that of the ON resistance of the transistors, but the material used for the passive resistors is either metal or highly doped semiconductor to minimize temperature sensitivity and thermal noise.

The methods and structures of the present disclosure provide monolithic integration of a vertical passive resistor with vertical active elements, e.g., transistors. This approach substantially reduces area consumption. The resistance value of a passive resistor is given by $R=\rho L/A$, where $\rho$ is the resistivity of the material, L is the length of the resistor in the direction of current flow, and A the cross sectional area of the resistor perpendicular to current flow. The vertical structure allows L, i.e., the height of the resistor structure) to be arbitrarily large, while A (i.e., the footprint of the resistor/transistor pair) to be small. Both a large L value, and a small A value simultaneously favoring a large R.

The methods and structures of the present disclosure are vertically orientated designs that provide space savings compared to planar, i.e., horizontally, orientated devices. The methods and structures provided herein can produce vertically orientated four terminal devices. It is noted that the resistive portion of the vertically orientated epitaxially grown semiconductor material may have a height, i.e., length, that can be adjusted according to the resistive needs of the device. Therefore, the height depicted in the supplied figures are illustrative of only one embodiments, and are not intended to limit the present disclosure. As will be described in further detail below, the epitaxial growth of the material for the resistive portion of the device allows for one of ordinary skill in the art to adjust the resistive region to tune the desired resistance, i.e., control the dopant species, dopant concentration, doping level, epitaxial thickness and/or size. The methods and structures of the present disclosure are now described with greater detail with reference to FIGS. 1-21.

Figure 1:
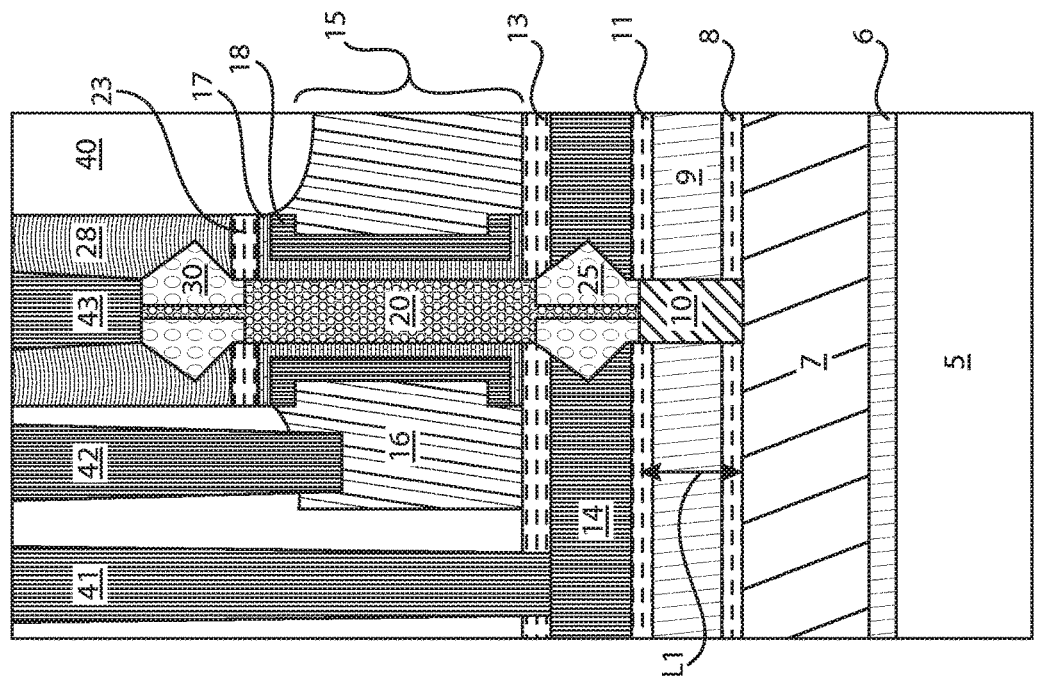
FIG. 1 is a side cross-sectional view depicting one embodiment of a passive electrical device, e.g., a passive resistor, integrated with a metal oxide semiconductor field effect transistor (MOSFET) having a vertical orientation, in which the body of the passive resistor is positioned between the channel portion of the vertically orientated MOSFET and a supporting substrate, in accordance with the present disclosure.

FIG. 1 depicts one embodiment of a transistor and resistor loaded inverter that includes a passive resistor, integrated with a metal oxide semiconductor field effect transistor (MOSFET) having a vertical orientation, in which the body 10 of the passive resistor is positioned between the channel region 20 of the vertically orientated MOSFET and a supporting substrate 5.

Figure 3:
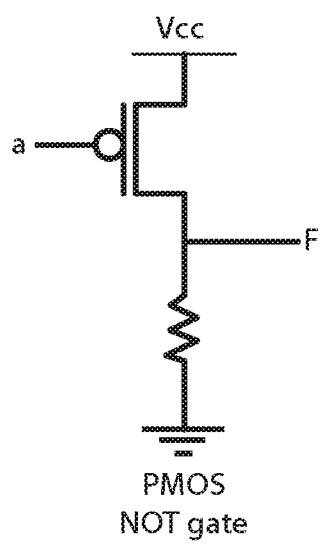
FIG. 3 is a circuit diagram of the inverter depicted in FIGS. 1 and 2.
Figure 12:
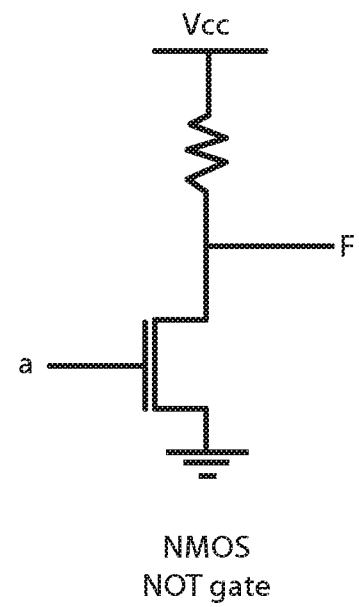
FIG. 12 is a circuit diagram of the inverter depicted in FIGS. 10 and 11.
Figure 11:
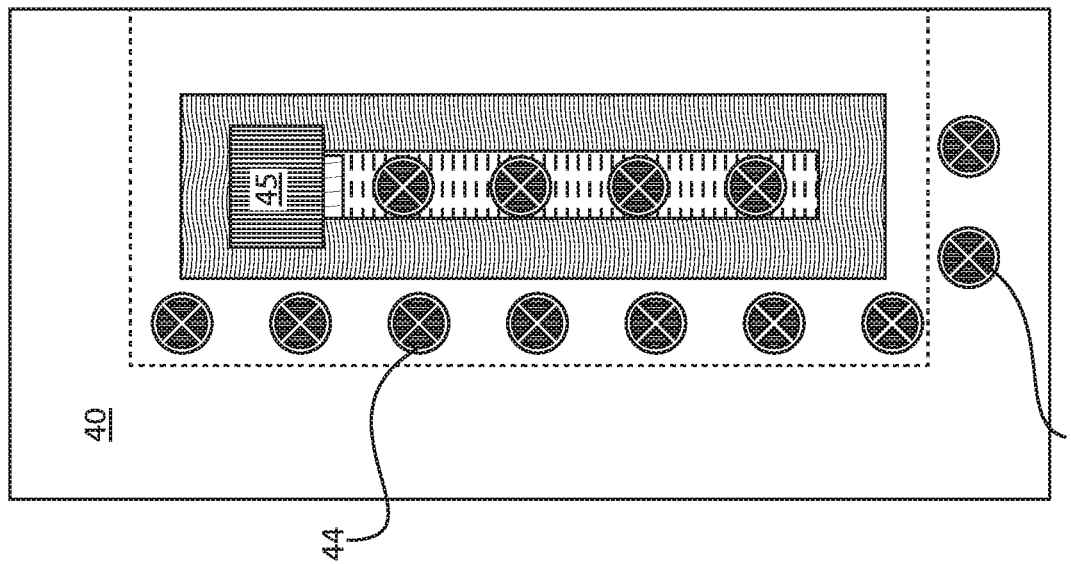
FIG. 11 is a top down view of the structure depicted in FIG. 10.
Figure 10:
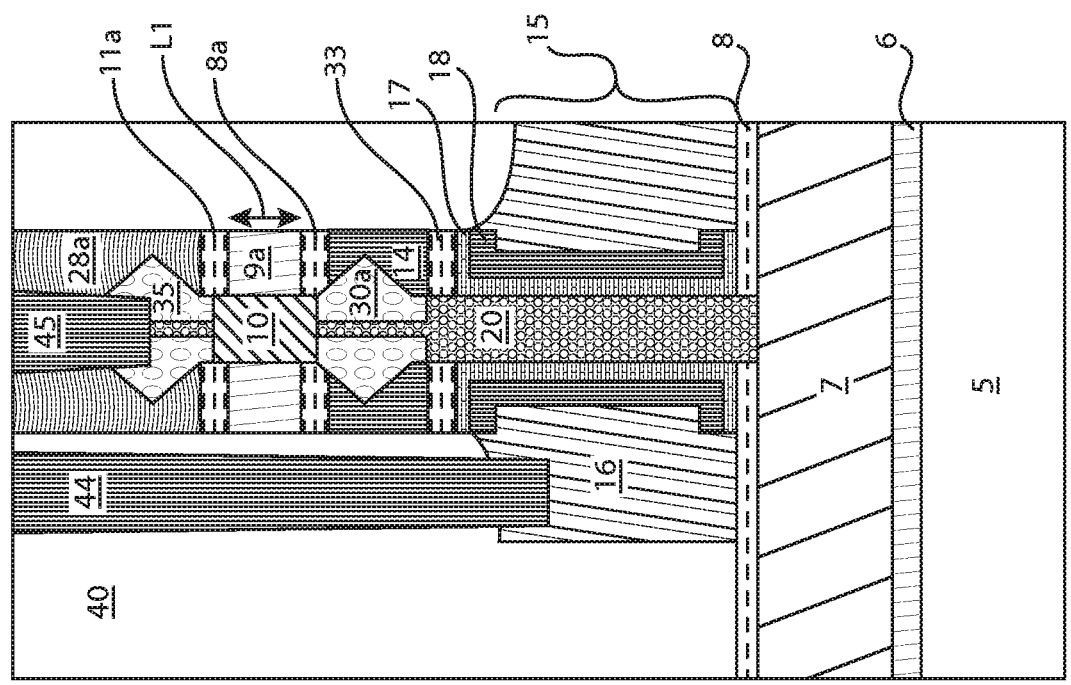
FIG. 10 is a side cross-sectional view depicting an inverter including a passive electrical device, e.g., a passive resistor, integrated with a metal oxide semiconductor field effect transistor (MOSFET) having a vertical orientation, in which the body of passive resistor is positioned atop the channel portion of the vertically orientated MOSFET, the channel portion of the vertically orientated MOSFET positioned between the body of the passive resistor and a supporting substrate, in accordance with the present disclosure.

FIGS. 1-3 and FIGS. 10-12 illustrate some embodiments of a MOSFET and a resistor that can be used in an inverter circuit. In some embodiments, an inverter circuit outputs a voltage representing the opposite logic-level to its input. Its function can be to invert the input signal applied. If the applied input is low then the output becomes high and vice versa. Inverters can be constructed using a single NMOS transistor or a single PMOS transistor coupled with a resistor. Since this 'resistive-drain' approach uses only a single type of transistor, it can be fabricated at low cost. However, because current flows through the resistor in one of the two states, the resistive-drain configuration is disadvantaged for power consumption and processing speed. The inverter depicted in FIGS. 1-3 is one example of a PMOS transistor being coupled with a resistor. The inverter depicted in FIGS. 10-12 is one example of an NMOS transistor coupled with a resistor. In a MOSFET inverter circuits, a load resistor R and MOS transistor connected in series between supply voltage (VDD) and ground. If Vin is less than the threshold voltage of MOS transistor, the transistor is off.

FIG. 1 depicts one embodiment of a body 10 of a passive resistor monolithically integrated with a channel region 20 of a metal oxide semiconductor field effect transistor (MOSFET) having a vertical orientation, in which the resistor is positioned between the channel of the MOSFET and the supporting substrate 5. The term "monolithically" denotes that the body 10 of the resistor and the channel region 20 of the MOSFET are composed of the same semiconductor material. Because the body 10 of the resistor and the channel region 20 of the MOSFET are provided by the same epitaxially formed semiconductor material, the sidewalls of the body 10 of the resistor and the channel region 20 of the MOSFET are aligned. Further, the body 10 of the resistor and the channel region 20 of the MOSFET are stacked, i.e., vertically stacked.

Referring to FIG. 1, the electrical device that provides the inverter structure includes a supporting substrate 5. The supporting substrate 5 is typically composed of a semiconductor material, such as a type IV semiconductor, e.g., silicon, and/or a type III-V semiconductor, e.g., gallium arsenide (GaAs). A counter doped region 6 is present atop the supporting substrate 5. In the embodiment that is depicted in FIG. 1, a heavily doped source region layer 7 (GROUND (for the inverter) is present on the counter doped region 6. In some embodiments, both the counter doped layer 6 and the heavily doped source region layer 7 can be epitaxially formed semiconductor materials, which can be type IV semiconductors, such as silicon (Si), germanium (Ge), and/or silicon germanium (SiGe), or can be type IIIV semiconductors, such as gallium arsenide (GaAs). The counter doped region 6 can function as an isolation layer, electrically isolating the supporting substrate 5 from the heavily doped source layer 7. Therefore, the counter doped layer 6 and the heavily doped source region layer 7 are doped to opposite conductivity types. The MOSFET depicted in FIGS. 1 and 2 is a p-type MOSFET. Therefore, the heavily doped source region layer 7 is doped to a p-type conductivity. As the counter doped region 6 has an opposite conductivity type as the heavily doped source region layer 7, the counter doped region 6 is doped to an n-type conductivity.

The heavily doped source region layer 7 can provide both the source region of the MOSFET and an electrode for the passive resistor.

The body 10 of the passive resistor is present in direct contact, i.e., epitaxial relationship, with the heavily doped source region layer 7, and is monolithically integrated with a channel region 20 of the metal oxide semiconductor field effect transistor (MOSFET) having a vertical orientation. This is provided by epitaxial growth of both the body 10 of the passive resistor and the channel region 20 in the same fin geometry opening using the heavily doped source region layer 7 as the epitaxial growth surface. The body 10 of the passive resistor and the channel region 20 may be composed of a type IV semiconductor, such as silicon, germanium or silicon germanium, and/or a type III-V semiconductor material, such as gallium arsenide (GaAs).

The dimensions, material composition, dopant type and dopant concentration of the resistor body 10 is selected to provide the resistance properties of the passive resistor for the inverter. For example, the body 10 of the passive resistor has a greater resistance than the channel portion 20 of the monolithically integrated structure.

The resistance value of the body 10 for the passive resistor is given by $R=\rho L/A$, where $\rho$ is the resistivity of the material, L is the length of the resistor in the direction of current flow, and A the cross sectional area of the resistor perpendicular to current flow. The vertical structure allows L, i.e., the height of the resistor structure) to be arbitrarily large, while A (i.e., the footprint of the resistor/transistor pair) to be small. Both a large L value, and a small A value simultaneously favoring a large R. The length L1 of the body 10 of the passive resistor can be increased to increase the resistance of the passive resistor. This can be a function of the length of the epitaxial growth process for forming the body 10 of the passive resistor.

The body 10 of the passive resistor, i.e., length L1 of the body of the passive resistor, can extend through a material stack of dielectric materials that can be on the order of three separate dielectric layers. For example, in the embodiment that is depicted in FIG. 1, a first resistor body level spacer 8 is present on the heaving doped source region layer 7, an resistor body level dielectric layer 9 is present on the first resistor body level spacer 8, and a second resistor body level spacer 11 is present on the resistor body level dielectric layer 9. Each of these dielectric layers may be composed of a nitride, oxide or oxynitride material, as well as other dielectric materials employed in semiconductor devices.

Still referring to FIG. 1, a doped epitaxial semiconductor material having source doping 25 is present at the interface of the body 10 of the passive resistor, and the channel region 20 of the MOSFET. The doped epitaxial semiconductor material having source doping 25 may be doped to an n-type or p-type conductivity, and may be composed of a type IV semiconductor material, e.g., silicon, or a type III-V semiconductor material, e.g., gallium arsenide (GaAs). The geometry of the doped epitaxial semiconductor material having the source doping 25 may be facetted having sidewalls coming to an apex in a diamond like shape. The doped epitaxial semiconductor material having the source doping 25 may provide a source region for the MOSFET, as well as provide a terminal for the passive resistor that includes the resistor body 10.

Referring to FIGS. 1 and 2, the doped epitaxial semiconductor material having the source doping 25 is in connection with an electrically conductive line 14 to an output via 41 to provide an output for the inverter device. The electrically conductive line 14 and the output via 41 may each be composed of a metal. The metal used for each of the electrically conductive line 14 and the output via 41 may be provided by copper, aluminum, silver, gold, platinum, tungsten, tantalum and combinations thereof.

The electrically conductive line 14 that is in direct contact with the doped epitaxial semiconductor material having the source doping 25 is present atop the second resistor body level dielectric spacer 11 and is separated from the gate structure by a lower gate sidewall spacer 13. The lower gate sidewall spacer 13 is composed of a dielectric material, such as silicon nitride.

The gate structure 15 for the MOSFET may include a gate dielectric 17 that is present directly on the channel region 20 of the MOSFET. The gate dielectric 17 may be a high-k dielectric material. One example of a high-k material for the gate dielectric 17 is hafnium oxide ($HfO_2$). The gate structure 15 also includes a gate electrode 16, which may be an electrically conductive material, such as a doped semiconductor material, such as n-type polysilicon. In some embodiments, a work function adjusting layer 18, such as an n-type or p-type work function adjusting layer, is present between the gate electrode 16 and the gate dielectric 17. The gate structure 15 is contacted by a gate contact via 42. The gate contact via 42 is composed of an electrically conductive material, such as a doped semiconductor or a metal, and provides the input for the inverter. The gate structure 15 may be a gate all around (GAA) gate structure that is present around an entirety of the channel region 20 portion of the monolithic epitaxially formed structure (having a FIN geometry)

An epitaxially formed drain region 30 is present on the end of the channel region 20 that is opposite the end of the channel region 20 that is in closest proximity to the resistor body 10 of the passive resistor. The epitaxially formed drain region 30 may be composed of a type IV semiconductor, such as silicon, silicon germanium and/or germanium, or the epitaxially formed drain region may be composed of a type III-V semiconductor, such as gallium arsenide (GaAs). The epitaxially formed drain region 30 may be doped to an n-type or p-type conductivity. In the embodiment depicted in FIGS. 1-3, the epitaxially formed drain region 30 is doped to a p-type conductivity. The geometry of the epitaxial formed drain region 30 may be facetted having sidewalls coming to an apex in a diamond like shape.

The epitaxially formed drain region 30 may be separated from the gate structure 15 by an upper gate sidewalls spacer 23, which can be composed of a dielectric, such as an oxide, e.g., silicon oxide, and/or a nitride, such as silicon nitride. Sidewall spacers 28 that are also composed of a dielectric material may be present on sidewalls of the epitaxially formed drain region 30. The epitaxially formed drain region 30 is contacted by the drain contact via 43. The drain contact via 43 is composed of an electrically conductive material, such as a doped semiconductor or a metal, and provides for contact of the inverter to the positive power supply (VDD).

An interlevel dielectric layer 40 may encapsulate a majority of the inverter, in which the drain contact via 43, the gate contact via 42 and the output via 41 extend through the interlevel dielectric layer 40. The contact identified by reference number 46 can be an alternate output for the inverter.

The structures described above with reference to FIGS. 1-3 are now described in more detail with reference to FIGS. 4-9, which illustrate one embodiment of a method for forming an inverter including a MOSFET having a vertically orientated channel 20 monolithically integrated with the body 10 of a passive resistor.

Figure 4:
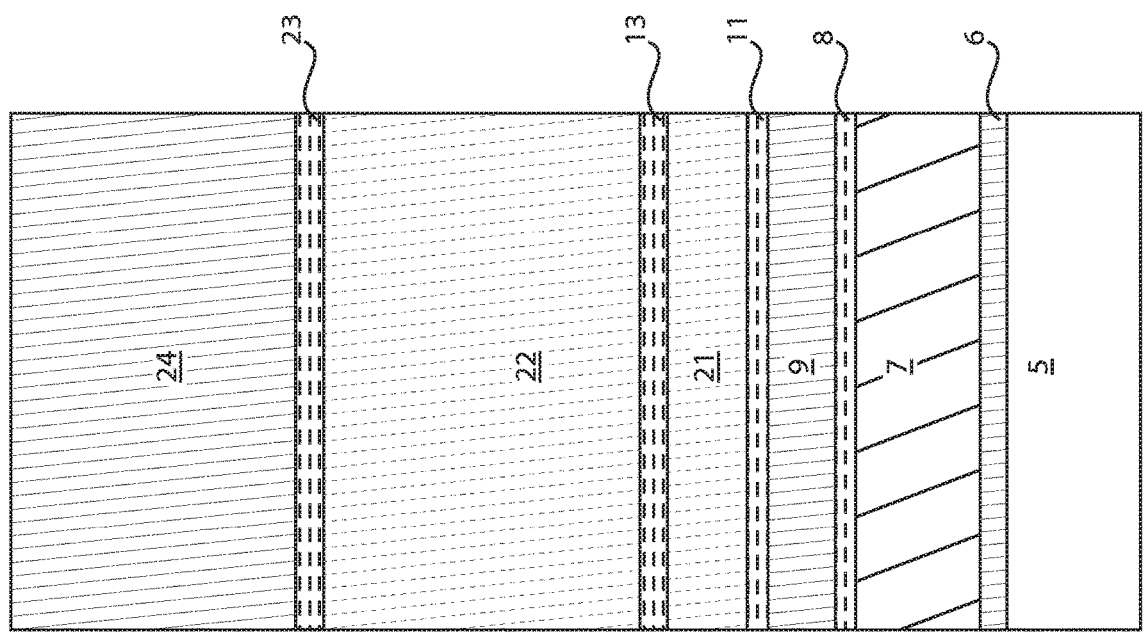
FIG. 4 is a side cross-sectional view of a material stack that provides an initial structure for use in a method for forming an inverter structure as depicted in FIGS. 1-3.

FIG. 4 depicts one embodiment of material stack that provides an initial structure for use in a method for forming an inverter structure, as depicted in FIGS. 1-3. In some embodiments, the initial material stack includes a supporting substrate 5, a counter doped layer 6, and a heaving doped source region layer 7 that is present atop the counter doped layer. The counter doped layer 6 may be formed on the upper surface of the supporting substrate 5 by ion implantation or by epitaxial growth in combination with in situ doping or ion implantation. The counter doped layer 6 may have a thickness ranging from 5 nm to 50 nm. The material layer for providing the heaving doped source region layer 7 may also be formed using ion implantation or epitaxial growth in combination with ion implantation or in situ doping. The thickness for the material layer for the heaving doped source region layer 7 typically ranges from about 10 nm to about 100 nm.

Still referring to FIG. 4, a dielectric stack is present atop the aforementioned structure that corresponds to the level in which the body 10 of the passive resistor is to be formed. The dielectric stack includes a first resistor body level spacer 8 that is present atop the heavily doped source region layer 7, a resistor body level dielectric layer 9 present on the first resistor body level spacer 8, and a second resistor body level spacer 11 is present on the resistor body level dielectric layer 9. Each of these dielectric layers may be composed of a nitride, oxide or oxynitride material, as well as other dielectric materials employed in semiconductor devices. The composition of these dielectric layers can be selected to provide for selective etching between the layers and the adjacent layers to the dielectric stack. The thickness of the resistor body level dielectric layer 9 is selected to provide the length L1 of the body 10 for the passive resistor. Each of the first resistor body level spacer 8, the resistor body level dielectric layer 9, and the second resistor body level spacer 11 may be deposited using a chemical vapor deposition process, such as plasma enhanced chemical vapor deposition (PECVD).

A sacrificial electrical contact layer 21, which may also be referred to as a dummy electrical contact layer, is present on the second resistor body level spacer 11. The sacrificial electrical contact layer 21 may be composed of any material that can be removed selectively to the second resistor body level spacer 11, and the overlying lower gate sidewall spacer layer 13. In some embodiments, the sacrificial electrical contact layer 21 may be composed of a silicon containing material, such as amorphous silicon (α-Si). The sacrificial electrical contact layer 21 may be formed using a deposition process, such as chemical vapor deposition (CVD), plasma enhanced chemical vapor deposition (PECVD), metal organic chemical vapor deposition (MOCVD), room temperature chemical vapor deposition (RTCVD), high density plasma chemical vapor deposition (HDPCVD) and combinations thereof.

Still referring to FIG. 4, a first dielectric spacer layer that provides the lower gate sidewall spacer 13 (also referred to as bottom gate sidewall spacer) of the vertical transistor device is formed on the upper surface of the sacrificial electrical contact layer 21. The first dielectric spacer layer may be formed using a deposition process, such as chemical vapor deposition (CVD), plasma enhanced chemical vapor deposition (PECVD), metal organic chemical vapor deposition (MOCVD), room temperature chemical vapor deposition (RTCVD), high density plasma chemical vapor deposition (HDPCVD) and combinations thereof. The first dielectric spacer layer that provides the lower gate sidewall spacer 13 may be composed of any dielectric material, and in some instances may be composed of silicon oxide or silicon nitride. In some embodiments, the lower gate sidewall spacer 13 can be composed of a low-k material. As used herein, the term "low-k" denotes a dielectric material having a dielectric constant equal to the dielectric constant of silicon oxide ($SiO_2$) or less. Examples of materials suitable for the low-k dielectric material include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The thickness of the lower gate sidewall spacer 13 may range from 5 nm to 20 nm.

A sacrificial gate structure layer 22, which may also be referred to as a dummy gate layer, is present on the dielectric layer that provides the lower gate sidewall spacer 13. The sacrificial gate structure layer 22 may be composed of any material that can be removed selectively to the lower gate sidewall spacer 13. In some embodiments, the sacrificial gate structure layer 22 may be composed of a silicon containing material, such as amorphous silicon (α-Si). The sacrificial gate structure layer 60 may be formed using a deposition process, such as chemical vapor deposition (CVD), plasma enhanced chemical vapor deposition (PECVD), metal organic chemical vapor deposition (MOCVD), room temperature chemical vapor deposition (RTCVD), high density plasma chemical vapor deposition (HDPCVD) and combinations thereof.

A second dielectric spacer layer that provides the upper gate sidewall spacer 23 (also referred to as top gate sidewall spacer) of the vertical transistor device is formed on the sacrificial gate structure layer 23. The upper gate sidewall spacer 23 is similar to the lower gate sidewall spacer 13. Therefore, the above description of the composition, thickness and method of forming the first dielectric spacer layer is suitable for describing forming the second dielectric spacer layer. For example, the second dielectric spacer layer may be composed of silicon oxide or silicon nitride.

A cap dielectric layer 24 is formed on the second dielectric spacer layer that provides the upper gate sidewall spacer 23. The cap dielectric layer 24 in some examples may be composed of an oxide, such as silicon oxide. The selection of the composition of the cap dielectric layer 24 and the second dielectric spacer layer that provides the upper gate sidewall spacer 23 can be selected to provide that the cap dielectric layer 24 can be removed by an etch process that is selective to the upper gate sidewall spacer 23. The upper gate sidewall spacer 23 protects the sacrificial gate structure layer 22 from being etched by the process steps that remove the cap dielectric layer 24.

Figure 5:
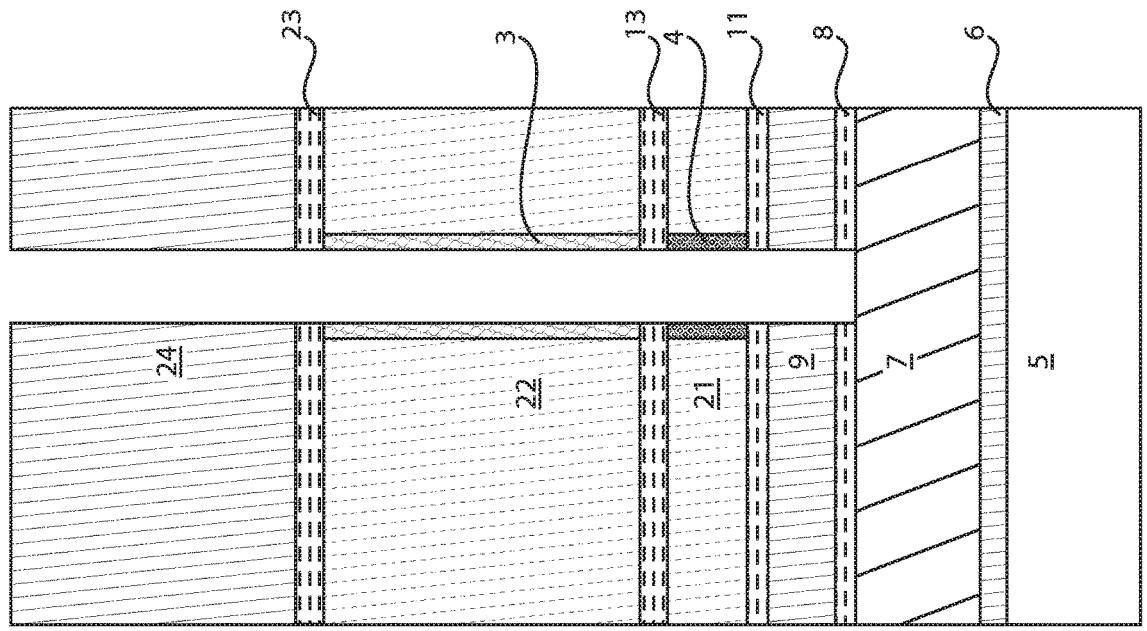
FIG. 5 is a side cross-sectional view of forming a trench through the material stack depicted in FIG. 4 to expose a surface of a heavily doped epitaxial source layer, in which the heavily doped source layer provides a surface for epitaxial growth.

FIG. 5 depicts forming a trench, i.e., fin structure opening, through the material stack depicted in FIG. 4 to expose a surface of a heavily doped epitaxial source layer 7, in which the heavily doped source layer 7 provides a surface for epitaxial growth of a fin structure geometry epitaxial material that provides the body 10 of the passive resistor and the channel of the MOSFET.

The trench opening, i.e., fin structure opening, can be formed using deposition, photolithography and etch processes. First, an etch mask is formed atop the material stack including the sacrificial gate layer 22, and the resistor body level dielectric layer 9, having openings exposing the portions of the material stack, in which the trench opening, i.e., fin structure openings, are formed. Specifically, a etch mask can be produced by applying a photoresist to the surface to be etched; exposing the photoresist to a pattern of radiation; and then developing the pattern into the photoresist utilizing conventional resist developer to produce the etch mask. Once the patterning of the photoresist is completed, the sections covered of the material stack covered by the etch mask are protected while the exposed regions are removed using an etching process that removes the unprotected regions. In some embodiments, the etch process may be an anisotropic etch that removes the exposed portions of the dielectric cap layer 24, the second dielectric spacer layer that provides the upper gate sidewall spacer 23, the sacrificial gate layer 22, the first dielectric spacer layer that provides the lower gate sidewall spacer 13, the sacrificial electrical contact layer 21, the first resistor body level spacer 8, the resistor body level dielectric layer 9, and the second resistor body level spacer 11 to expose a surface of the heavily doped source layer 7. For example, the etch process for forming the fin structure openings can be a reactive ion etch process.

Still referring to FIG. 5, following the formation of the fin structure openings, a thermal oxidation process forms a dielectric surface 3 of the sidewall surface of the sacrificial gate layer 22, and forms a dielectric surface on the sidewall surface of the sacrificial electrical contact layer 21, which are exposed within the trench openings, i.e., fin openings. In the embodiments in which the sacrificial gate layer 22 is composed of a silicon containing material, the dielectric surface 3 may be composed of an oxide, such as silicon oxide.

Figure 6:
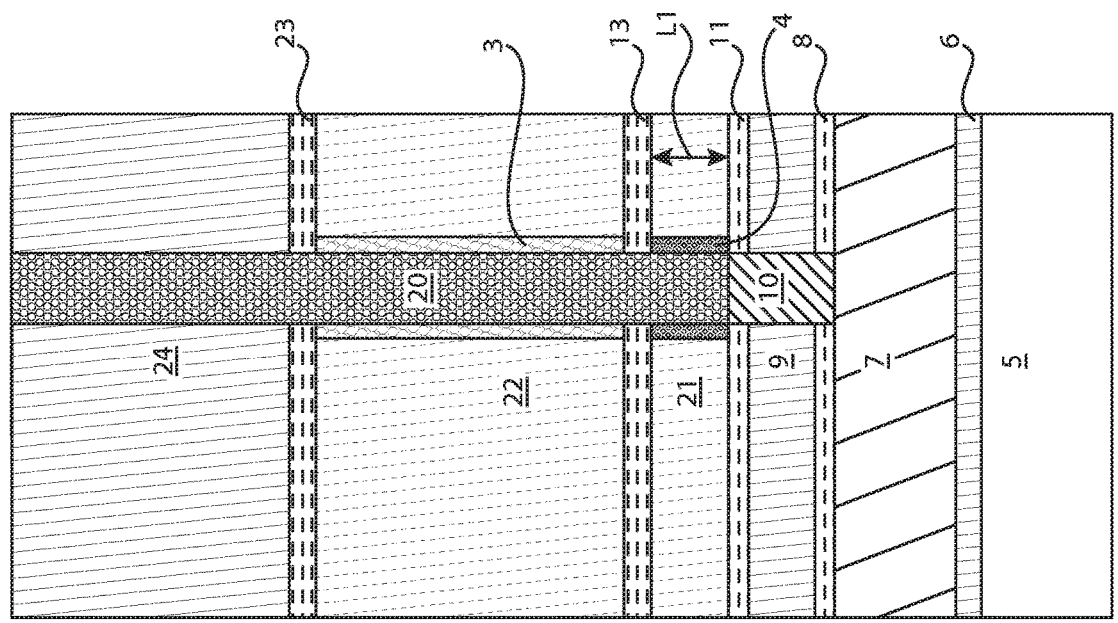
FIG. 6 is a side cross-sectional view of epitaxially forming a fin structure in the opening formed in FIG. 5, in which the epitaxial fin structure provides for a monolithic structure provides both the body for the passive resistor and the channel for the MOSFET.

FIG. 6 depicts one embodiment of epitaxially forming a fin structure in the opening formed in FIG. 5, in which the epitaxial fin structure provides for a monolithic structure provides both the body 10 for the passive resistor and the channel 20 for the MOSFET. The fin structures are formed filling the fin structure openings using an epitaxial deposition process that employs the electrically conductive surface region 20 at the base of the fin structure openings as an epitaxial deposition growth surface. The epitaxial semiconductor material that provides the fin structures does not form on dielectric surfaces, such as the dielectric cap layer 24 or the dielectric surface 3, 4 of the sacrificial gate layer 22, or the dielectric surface on the sacrificial electrical contact layer 21.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. The epitaxial deposition process may employ the deposition chamber of a chemical vapor deposition type apparatus, such as a RPCVD apparatus.

The epitaxially formed fin structures can be a type IV semiconductor containing material layer. In some embodiments, the gas source for the deposition of an epitaxially formed in situ doped n-type semiconductor material may include silicon (Si) deposited from silane, disilane, trisilane, tetrasilane, hexachlorodisilane, tetrachlorosilane, dichlorosilane, trichlorosilane, and combinations thereof. In other examples, when the in situ doped n-type semiconductor material 15 includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking.

The composition, dopant and dopant concentration of the first portion of the epitaxial growth period may be selected to provide the resistive properties of the body 10 of the passive resistor. The composition, dopant and the dopant concentration of the second portion of the epitaxial growth period may be selected to provide the semiconductor properties for the channel region 20 of the MOSFET. Both the body portion 10 of the passive resistor and the channel region 20 of the MOSFET may be epitaxially grown in the trench opening using the same epitaxial deposition chamber for both portions of the epitaxial growth process for forming the fin structure. Therefore, the epitaxial fin structure provides for a monolithic structure provides both the body 10 for the passive resistor and the channel 20 for the MOSFET.

Figure 7:
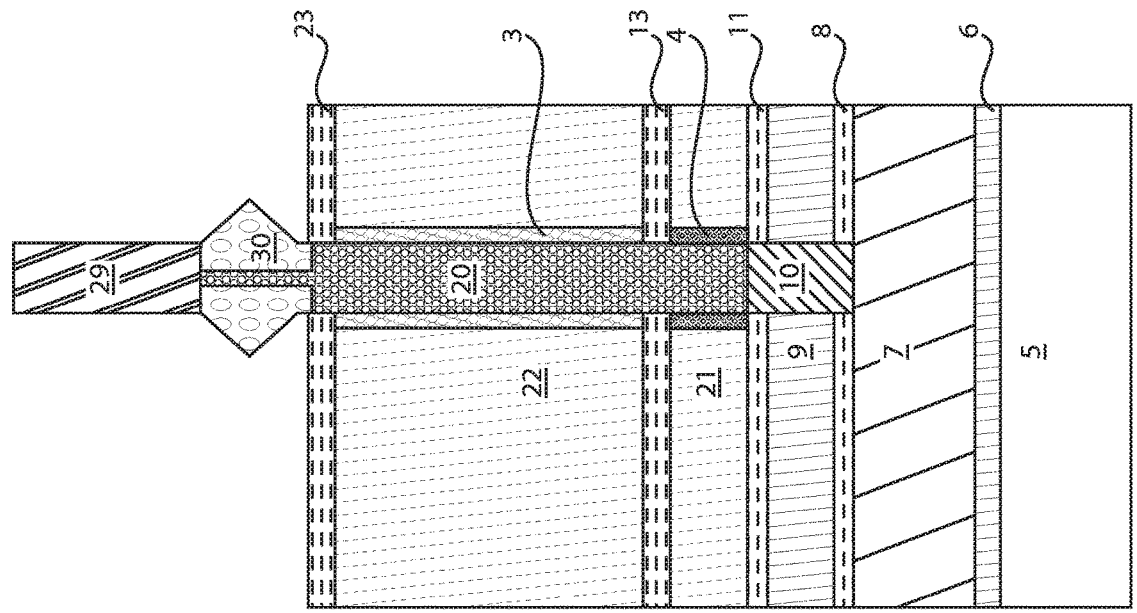
FIG. 7 is a side cross-sectional view depicting forming an epitaxial drain region, in accordance with one embodiment of the present disclosure.

FIG. 7 depicts forming an epitaxial drain region 30. In some embodiments, forming the process flow for forming the epitaxial drain region 30 may begin with recessing the fin structure. The fin structure may be recessed using an etch that is selective to the cap dielectric layer 24. Etching the epitaxially formed fin structures forms a recess in the upper portions of the trench opening, i.e., fin structure opening. The recess is filled with a deposited dielectric material to provide the dielectric cap 29. In some embodiments, the dielectric cap 29 may be composed of a nitride, such as silicon nitride, that is deposited using chemical vapor deposition (CVD), such as plasma enhanced chemical vapor deposition (PECVD).

Following formation of the dielectric cap 29, the cap dielectric layer 24 may be removed. The cap dielectric layer 24 may be removed by an etch process, such as a dry etch process, e.g., reactive ion etching, or wet etch, e.g., chemical etching, in which the etch process may be selective to the upper gate sidewall spacer layer 23. Because the epitaxial fin structure is only recessed to a portion of the thickness of the cap dielectric layer 24, removing the cap dielectric layer 24 exposes a sidewall portion of the fin structure that provides the drain region portion of the epitaxially formed fin structure for the MOSFET.

Still referring to FIG. 7, the drain region 30 may be epitaxially formed on the exposed sidewall of the fin structure. The epitaxial deposition process for forming the drain region 30 is similar to the epitaxial deposition process that provides the fin structure of epitaxial semiconductor material that provides the body 10 of the passive resistor and the channel 20 of the MOSFET. For example, the drain region 30 may be composed of a type IV semiconductor such as silicon. Therefore, the above process conditions for forming the fin structures is equally applicable for forming at least one embodiment of a drain region 30. It is noted that the epitaxial deposition process does not form epitaxial material on surfaces that are not composed of semiconductor material, such as the dielectric surfaces of the upper gate sidewall spacer layer 23, and the dielectric surfaces of the dielectric cap 29. In the embodiment that is depicted in FIG. 7, the epitaxial semiconductor material that provides the drain region 30 may have a diamond like geometry.

The epitaxial semiconductor material that provides the drain regions 30 is doped to an n-type or p-type conductivity. The n-type or p-type dopant may be formed using in situ doping or ion implantation. By "in-situ" it is meant that the dopant that dictates the conductivity type of the semiconductor material is introduced during the process step, e.g., epitaxial deposition, which forms the semiconductor material. In the embodiments described with reference to FIGS. 1-9, the drain region 30 can be doped to a p-type conductivity. A p-type dopant, such as borane and diborane gas, may be employed to in situ dope the drain region 30.

Figure 8:
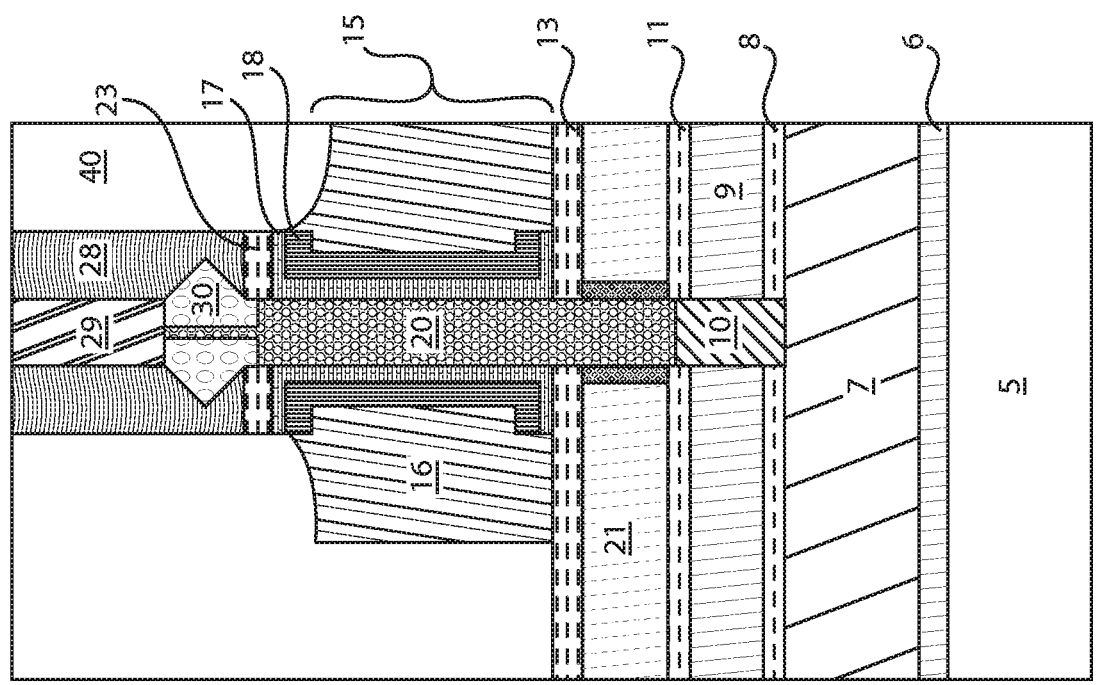
FIG. 8 is a side cross-sectional view depicting forming a gate structure for the MOSFET of the inverter.

FIG. 8 depicts forming a gate structure for the MOSFET of the inverter. In some embodiments, the process flow for forming the gate structure may begin with forming an encapsulating sidewall spacers 28 around the drain region 30; etching portions of the upper gate sidewall spacer layer 23, and sacrificial gate layer 22 with an anisotropic etch that is selective to the lower gate sidewall spacer layer 13; employing an isotropic etch to expose the sidewall surfaces of the channel region portion 20 of the fin structure; and forming a gate dielectric layer 17 on the exposed sidewall surfaces of the channel region portion 20 of the fin structure.

The encapsulating sidewall spacers 28 are formed on the exposed upper sidewalls of the drain region 30 using deposition process, such as plasma enhanced chemical vapor deposition (PECVD), following by an anisotropic etchback process, such as reactive ion etch. The encapsulating sidewall spacers 28 may also extend along sidewalls of the dielectric fin cap 29, and have an upper surface that is coplanar with the upper surface of the dielectric fin cap 29.

Following formation of the encapsulating spacers 28, an anisotropic etch process, such as reactive ion etch (RIE), removes the portions of the upper gate sidewall spacer layer 23, and the sacrificial gate structure layer 22 that are not directly underlying the encapsulating sidewall spacers 28. The etch process at this stage of the process flow may be selective to the encapsulating spacers 28, and the dielectric fin cap 29. The remaining portion of the sacrifice gate structure layer 22 that is underlying the encapsulating spacers 28 may then be removed by an isotropic etch, such as a plasma etch or wet chemical etch, which may be selective to the dielectric surface 3 of the sidewall surface of the sacrificial gate layer 22. Thereafter, the remaining dielectric surface 3 may be removed by an etch that is selective to the fin structures, which may also be an isotropic etch. Following the isotropic etch, the sidewalls of the fin structures that provide the channel region 20 of the MOSFET may be exposed.

Referring to FIG. 8, the gate dielectric 17 may then be formed on the exposed surfaces of the channel portion 20 of the fin structure. In some embodiments the gate dielectric 17 may be composed of a high-k gate dielectric. As used herein, "high-k" denotes a dielectric material featuring a dielectric constant (k) higher than the dielectric constant of $SiO_2$ at room temperature. For example, the gate dielectric 17 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. The gate dielectric 17 may be deposited using chemical vapor deposition methods, such as plasma enhanced chemical vapor deposition (PECVD). In other embodiments, the gate dielectric 17 may be deposited using atomic layer deposition (ALD).

FIG. 8 further depicts forming a metal work function adjusting layer 18 on the gate dielectric layer 17. The metal work function adjusting layer 18 may be deposited by CVD, e.g., plasma enhanced chemical vapor deposition (PECVD). In other examples, the metal work function adjusting layer 18 may be deposited using physical vapor deposition, such as sputtering. In yet further examples, the metal work function adjusting layer 18 may be deposited using plating, electroplating, electroless deposition, and combinations thereof.

After the deposition of the metal work function adjusting layer 18, an anisotropic etch process, such as reactive ion etch (RIE), removes the portions of the metal work function adjusting layer and the gate dielectric layer 17 that are not protected by the overlying encapsulating sidewall spacers 28 and the dielectric fin cap 29.

FIG. 8 also depicts forming a gate electrode 16 on the stack of the remaining portions of the work function adjusting metal layer 18 and the gate dielectric 17. The gate electrode 16 may be formed directly on the metal work function adjusting layer 17 and may be composed of a metal selected from tungsten (W), tungsten nitride (WN) or combinations thereof. The material layer for the gate electrode 16 may be deposited by CVD, e.g., plasma enhanced chemical vapor deposition (PECVD); and/or deposited using physical vapor deposition, e.g., sputtering. In another embodiment, the material layer for the gate electrode 16 may be deposited using plating, electroplating, electroless deposition, and combinations thereof. Following deposition, the material layer for the gate electrode 16 may be recessed by an etch process, such as reactive ion etch (RIE), to provide the desired height for the gate electrode 16. Once the gate electrode height is set, the gate electrode 16 may be patterned to provide its final geometry by employing photolithography and etch processing.

Referring to FIG. 8, after patterning the gate structure 15 to its final geometry, an interlevel dielectric layer 40 may be formed. The interlevel dielectric layer 40 may be deposited using chemical vapor deposition, deposition from solution, spin on deposition and combinations thereof. Following deposition, a planarization process may be applied to the upper surface of the interlevel dielectric layer 40.

Figure 9:
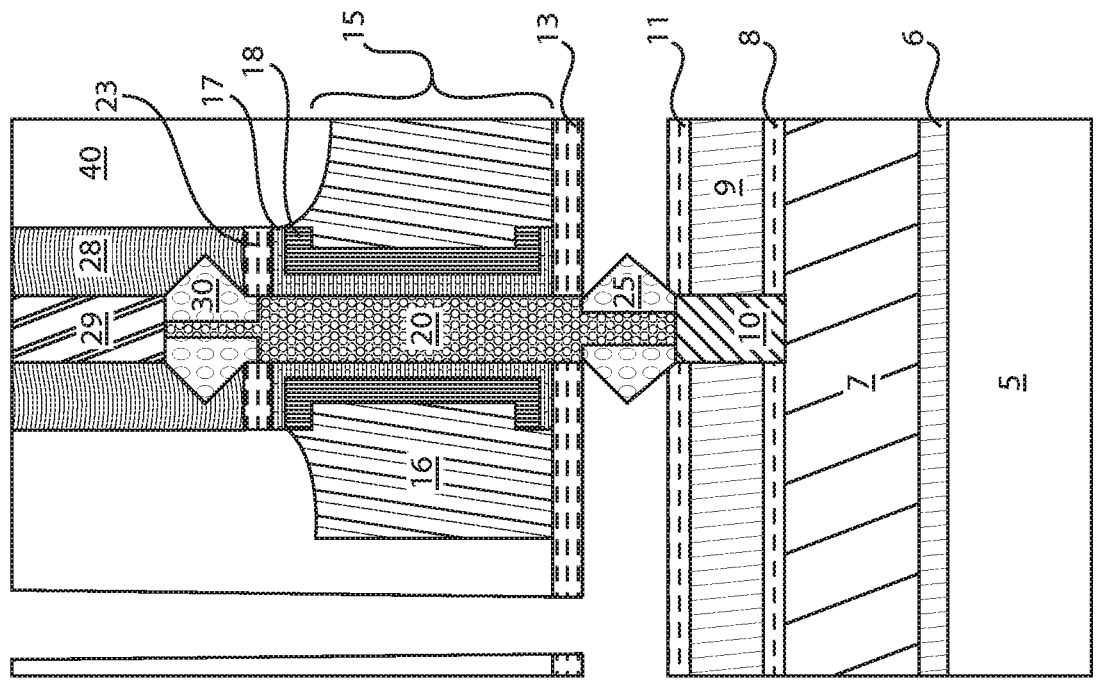
FIG. 9 is a side cross sectional view forming an epitaxial semiconductor material between the body of the passive resistor and the channel of the MOSFET, in accordance with one embodiment of the present disclosure.

FIG. 9 depicts one embodiment of forming an epitaxial semiconductor material 25 having the source type doping on the fin structure between the portion of the fin structure that provides the body 10 of the passive resistor and the portion of the fin structure that provides the channel 20 of the MOSFET. Forming the epitaxial semiconductor material 25 having the source type doping may begin with forming a via through the interlevel dielectric layer 40 exposing a portion of the sacrificial electrical contact layer 21. The via opening may be formed using photolithography and etch processes. For example, a photoresist mask may be formed exposing the portion of the dielectric material layers in which the via opening is to be formed, wherein following formation of the photoresist mask, the via opening may be etched into the interlevel dielectric 40 using an etch process, such as reactive ion etch. The via opening formed at this stage may provide the via opening for the subsequently formed output via contact 41.

Following the formation of the aforementioned via opening to the sacrificial electrical contact layer 21, the sacrificial electrical contact layer 21 can be removed by an etch that is selected to the fin structure. The etch process is isotropic, and is applied to the sacrificial electrical contact layer 21 through the via. The etch process may be provided by plasma etching. Following removal of the sacrificial electrical contact layer 21, the sidewall of the portion of the fin structure between the body portion 10 for the passive resistor, and the channel portion 20 for the MOSFET is exposed, and provides an epitaxial deposition surface. The epitaxial deposition process then forms the epitaxial semiconductor material 25 having the source type doping on the exposed portion of the fin structure that provides the epitaxial deposition surface.

The epitaxial deposition process for forming the epitaxial semiconductor material 25 having the source type doping is similar to the epitaxial deposition process that provides the drain region 30, as well as the epitaxial deposition process that provides the fin structure of epitaxial semiconductor material that provides the body 10 of the passive resistor and the channel 20 of the MOSFET. For example, the epitaxial semiconductor material 25 having the source type doping may be composed of a type IV semiconductor such as silicon. Therefore, the above process conditions for forming the fin structures is equally applicable for forming at least one embodiment of an epitaxial semiconductor material 25 having the source type doping. In the embodiment that is depicted in FIG. 9, the epitaxial semiconductor material that provides the epitaxial semiconductor material 25 having the source type doping may have a diamond like geometry. The deposition gasses reach the epitaxial deposition surface by introduction through the via opening and traveling along the space created by removing the sacrificial electrical contact layer 21

The epitaxial semiconductor material 25 having the source type doping is doped to an n-type or p-type conductivity. The n-type or p-type dopant may be formed using in situ doping. In the embodiments described with reference to FIGS. 1-9, the epitaxial semiconductor material 25 having the source type doping can be doped to a p-type conductivity. A p-type dopant, such as borane and diborane gas, may be employed to in situ dope the epitaxial semiconductor material 25 having the source type doping.

Following the formation of the epitaxial semiconductor material 25 having the source type doping, an electrically conductive material, such as a metal, e.g., copper, aluminum, titanium, tungsten, platinum, etc, is deposited filling the via opening and the space provided by removing the sacrificial electrical contact layer 21. The electrically conductive material filling this space can provide the electrically conductive line 14 to the output via contact 41 that provides an output for the inverter device. The electrically conductive material may be deposited into the via opening using physical vapor deposition (PVD). Examples of PVD processes suitable for depositing the electrically conductive material include plating, electroplating, electroless plating, sputtering and combinations thereof.

In some embodiment, forming the output via contact 41 is part of a process sequence that also includes forming the gate contact via 42 and the drain contact via 43. Both the gate conductive via 42 and the drain contact via 43 are composed of electrically conductive materials, such as metals, and are formed using photolithography, etching and deposition process steps. It is noted that the above process sequence only describes one embodiment of a process flow for forming the inverter that is depicted in FIGS. 1-3, and that other process flows including steps not described above may be applicable to the methods disclosed herein.

FIGS. 10-12 depict an inverter including a passive electrical device, e.g., a passive resistor, integrated with a metal oxide semiconductor field effect transistor (MOSFET) having a vertical orientation, in which the body 10 of passive resistor is positioned atop the channel 20 of the vertically orientated MOSFET. In the embodiment that is depicted in FIGS. 10-12, the channel 20 of the vertically orientated MOSFET positioned between the body 10 of the passive resistor and a supporting substrate 5. FIG. 12 is a circuit diagram of the inverter depicted in FIGS. 10 and 11. In some embodiments of the inverter depicted in FIGS. 10-12, the vertically orientated MOSFET is an n-type MOSFET having source and drain regions doped to an n-type conductivity.

The inverter depicted in FIGS. 1-3 is similar to the inverter that is depicted in FIGS. 10-12. Therefore, the structures having reference numbers in FIGS. 10-12 that have the same reference numbers as structures depicted in FIGS. 1-3 (also including the method described with reference to FIGS. 4-9) are equivalent to those same designated structures. Therefore, the description of the structures in FIGS. 1-9 having the same references numbers as the structures labeled in FIGS. 10-13 provide one embodiment of the description of the structures depicted in FIGS. 10-13.

In the embodiment that is depicted in FIG. 9, a heavily doped source region layer 7 (GROUND (for the inverter) is present on a counter doped region 6 that is overlying a supporting substrate 5. The MOSFET depicted in FIGS. 10-13 is an n-type MOSFET. Therefore, the heavily doped source region layer 7 is doped to an n-type conductivity. As the counter doped region 6 has an opposite conductivity type as the heavily doped source region layer 7, the counter doped region 6 is doped to an p-type conductivity. The heavily doped source region layer 7 can provide both the source region of the MOSFET (as in FIG. 10) and an electrode for the passive resistor (as in FIG. 1).

In the embodiment depicted in FIGS. 10-12, the channel 20 of the MOSFET having a vertical orientation is present in direct contact with the heavily doped source region layer 7, and is monolithically integrated with a body portion 10 of the passive resistor. This is provided by epitaxial growth of both the channel region 20 of the vertical MOSFET and the body 10 of the passive resistor in the same fin geometry opening using the heavily doped source region layer 7 as the epitaxial growth surface. The body 10 of the passive resistor and the channel region 20 may be composed of a type IV semiconductor, such as silicon, germanium or silicon germanium, and/or a type III-V semiconductor material, such as gallium arsenide (GaAs). Similar to the embodiments described with referenced to FIGS. 1-9, the dimensions, material composition, dopant type and dopant concentration of the resistor body 10 is selected to provide the resistance properties of the passive resistor for the inverter. For example, the body 10 of the passive resistor has a greater resistance that the channel portion 20 of the monolithically integrated structure.

A gate structure 15 is present about the channel portion 20 of the fin structure. The gate structure 15 has been described above with reference to FIGS. 1-9.

Still referring to FIG. 10, a doped epitaxial semiconductor material having drain doping 30a is present at the interface of the channel region of the MOSFET, and the body 10 of the passive resistor. The doped epitaxial semiconductor material having drain doping 25 may be doped to an n-type or p-type conductivity, and may be composed of a type IV semiconductor material, e.g., silicon, or a type III-V semiconductor material, e.g., gallium arsenide (GaAs). The geometry of the doped epitaxial semiconductor material having the drain doping 30a may be facetted having sidewalls coming to an apex in a diamond like shape. The doped epitaxial semiconductor material having the drain doping 30a may provide a drain region for the MOSFET, as well as provide a terminal for the passive resistor that includes the resistor body 10. In the embodiment depicted in FIGS. 10-12, the doped epitaxial semiconductor material having the drain doping 30a is doped to an n-type conductivity.

Referring to FIGS. 10 and 11, the doped epitaxial semiconductor material having the drain doping 30a may be contacted by a metal portion of a segmented line 14. The metal used for the segmented line 14 may be provided by copper, aluminum, silver, gold, platinum, tungsten, tantalum and combinations thereof.

The body 10 of the passive resistor is present atop the doped epitaxial semiconductor material having the drain doping 30a. Similar, to the embodiment described with reference to FIGS. 1-3, the resistance value of the body 10 for the passive resistor is given by $R=\rho L/A$, where p is the resistivity of the material, L is the length of the resistor in the direction of current flow, and A the cross sectional area of the resistor perpendicular to current flow. The vertical structure allows L, i.e., the height of the resistor structure) to be arbitrarily large, while A (i.e., the footprint of the resistor/transistor pair) to be small. Both a large L value, and a small A value simultaneously favoring a large R. The length L1 of the body 10 of the passive resistor can be increased to increase the resistance of the passive resistor. This can be a function of the length of the epitaxial growth process for forming the body 10 of the passive resistor.

An epitaxially formed drain region 35 is present on the end of the body portion 10 that is opposite the end of the boy portion 10 for the passive resistor that is in closest proximity to the channel region 20 of the MOSFET. The epitaxially formed drain region 35 may be composed of a type IV semiconductor, such as silicon, silicon germanium and/or germanium, or the epitaxially formed drain region may be composed of a type III-V semiconductor, such as gallium arsenide (GaAs). The epitaxially formed drain region 35 may be doped to an n-type or p-type conductivity. In the embodiment depicted in FIGS. 10-12, the epitaxially formed drain region 35 is doped to an n-type conductivity. The geometry of the epitaxial formed drain region 35 may be facetted having sidewalls coming to an apex in a diamond like shape. In the embodiment depicted in FIGS. 10-12, the drain region is n-type.

Referring to FIGS. 10-12, a drain contact via 45 is in direct contact with the epitaxial formed drain region 35. The drain contact via 45 can be composed of an electrically conductive material, such as a doped semiconductor or a metal, and provides for contact of the inverter to the positive power supply (VDD). The inverter also includes a gate contact 44 that is in direct contact with the gates structure 15, in which the gate contact 44 provides the input to the inverter. A source contact (GRND) 46 is also present.

The structures described above with reference to FIGS. 10-12 are now described in more detail with reference to FIGS. 13-17.

FIG. 13 depicts one embodiment of material stack that provides an initial structure for use in a method for forming an inverter structure, as depicted in FIGS. 10-12. In some embodiments, the initial material stack includes a supporting substrate 5, a counter doped layer 6, and a heaving doped source region layer 7 that is present atop the counter doped layer. Each of these layers have been described above. For example, each of these structures designated by the same reference numbers have been described above with reference to FIG. 4. Therefore, the description for these material layers provided with reference to FIG. 4 is suitable for describing the material layers having the same reference numbers in FIG. 13 with the exception that the heavily doped source region layer 7 depicted in FIG. 4 is a p-type doped layer, and the heavily doped source region layer 7 depicted in FIG. 13 is an n-type doped layer.

Still referring to FIG. 13, a stack of material layer for forming a gate structure is present atop the heavily doped source layer 7. The stack for forming the gate structure including a lower gate sidewall spacer 31 present atop the heavily doped source layer 7, a sacrificial gate layer 32 present on the lower gate sidewall spacer 31, and a upper gate sidewall spacer 33 present atop the sacrificial gate layer 32. The lower gate sidewall spacer 31 that is depicted in FIG. 13 is similar to the first dielectric layer that provides the lower gate sidewall spacer 13 depicted in FIG. 4. Therefore, the description of the first dielectric layer that provides the lower gate sidewall spacer depicted in FIG. 4 provides the description of at least one embodiment of the lower gate sidewall spacer depicted in FIG. 13. The sacrificial gate layer 32 that is depicted in FIG. 13 is similar to the sacrificial gate layer 22 depicted in FIG. 4. Therefore, the description of the sacrificial gate layer 22 depicted in FIG. 4 is suitable for describing one embodiment of the sacrificial gate layer 32 that is depicted in FIG. 13. The upper gate sidewall spacer 33 depicted in FIG. 13 is similar to the second dielectric layer that provides the upper gate sidewall spacer 23 depicted in FIG. 4. Therefore, the description of the second dielectric layer that provides the upper gate sidewall spacer depicted in FIG. 4 provides the description of at least one embodiment of the upper gate sidewall spacer depicted in FIG. 13.

A sacrificial electrical contact layer 34, which may also be referred to as a dummy electrical contact layer, is present on the upper gate sidewall spacer 33. The sacrificial electrical contact layer 34 depicted in FIG. 13 is similar to the sacrificial electrical contact layer 21 depicted in FIG. 4. Therefore, the description of the sacrificial electrical contact layer 21 depicted in FIG. 4 provides the description of at least one embodiment of the sacrificial electrical contact layer 34 depicted in FIG. 13.

Still referring to FIG. 13, a dielectric stack is present atop the aforementioned structure that corresponds to the level in which the body 10 of the passive resistor is to be formed. The dielectric stack includes a first resistor body level spacer 8a that is present atop the sacrificial electrical contact layer 34, a resistor body level dielectric layer 9a present on the first resistor body level spacer 8a, and a second resistor body level spacer 11a is present on the resistor body level dielectric layer 9a. A description of each of the aforementioned layers is provided by the description of the resistor body level spacer 8, the resistor body level dielectric layer 9, and the second resistor body level spacer 11 in FIG. 4.

A cap dielectric layer 24 is formed on the second resistor body level spacer 11a. The cap dielectric layer that is depicted in FIG. 13 is similar to the cap dielectric layer that is depicted in FIG. 4.

FIG. 14 depicts one embodiment of forming a trench through the material stack depicted in FIG. 13 to expose a surface of a heavily doped epitaxial source layer 7, and epitaxially forming a fin structure in the opening, in which the heavily doped source layer 7 provides a surface for epitaxial growth. The epitaxial formed fin structure includes a first portion, i.e., including the channel portion 20, for the MOSFET that is formed first on the heavily doped epitaxial source layer followed by a second portion of the fin structure, i.e., including the body portion 10, for the passive resistor. In some embodiments, dielectric surfaces 3, 4 may be formed on the exposed semiconductor surfaces of the trench sidewalls prior to the epitaxial growth process. The methods for forming the trench and the epitaxial growth process for forming the fin structure depicted in FIG. 14 are similar to the trench forming and epitaxial growth process that has been described above with reference to FIGS. 5 and 6. Therefore, with adjustments made to form the channel region portion 20 prior to the body portion, the methods for trench forming and epitaxial growth that are described with reference to FIGS. 5 and 6 are suitable for description with reference to FIG. 14.

Figure 15:
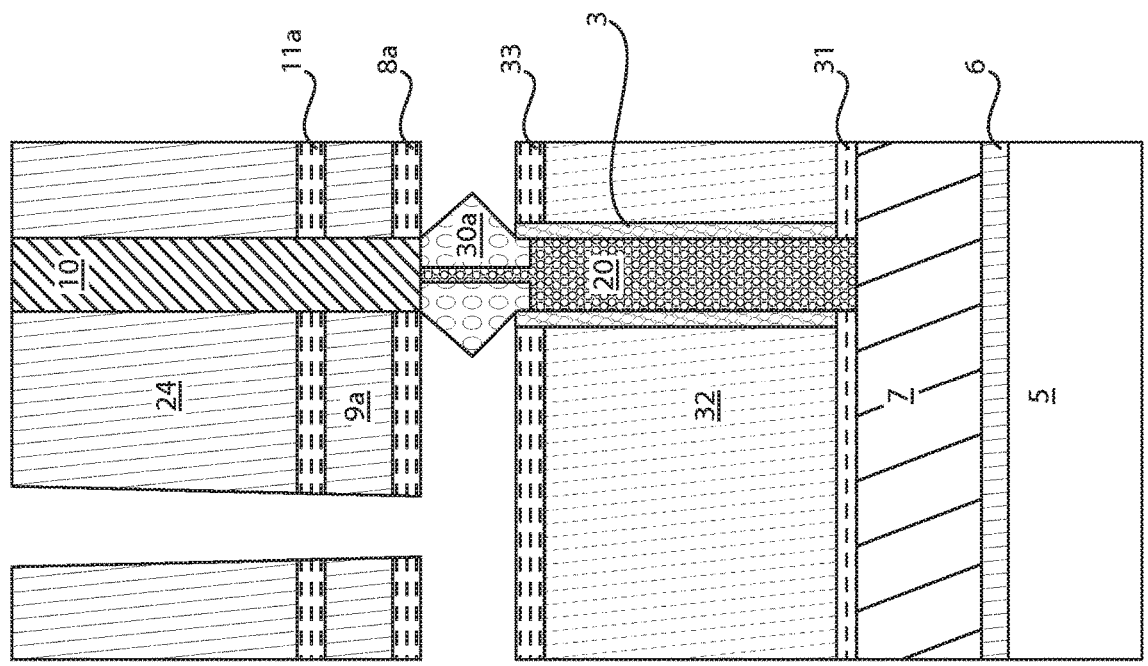
FIG. 15 is a side cross-sectional view depicting forming an epitaxial semiconductor material between the section of the fin structure that provides the channel region of the MOSFET and the section of the fin structure that provides the body of the passive resistor, in accordance with one embodiment of the present disclosure.

FIG. 15 depicts forming an epitaxial semiconductor material 30a having the drain doping between the section of the fin structure that provides the channel region 20 of the MOSFET and the section of the fin structure that provides the body 10 of the passive resistor. The epitaxial semiconductor material 30a having the drain doping depicted in FIG. 15 may be doped to an n-type conductivity. In some embodiments, the process sequence depicted in FIG. 15 includes forming a via opening to the sacrificial electrical contact line 34, removing the sacrificial electrical contact line 34 using an etchant that exposes the sidewall of the epitaxial fin structure, and epitaxially forming the epitaxial semiconductor material 30a having the drain doping on the exposed sidewall of the fin structure. A similar process sequence has been described with reference to FIG. 9, which can provide the details for at least one method of forming the epitaxial semiconductor material 30a that is depicted in FIG. 15. After forming the epitaxial semiconductor material 30a having the source type doping, the metal layer identified by reference number 14 can be deposited in the space that is produced by removing the sacrificial electrical contact line 34.

Figure 16:
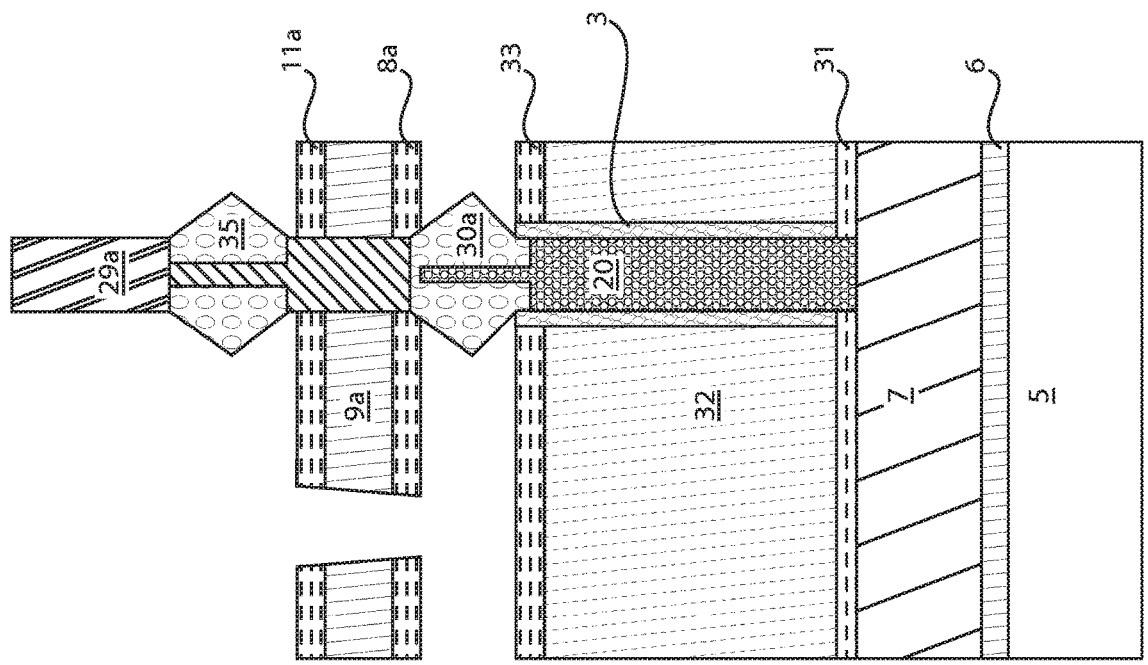
FIG. 16 is a side cross-sectional view depicting forming an epitaxial drain region, in accordance with one embodiment of the present disclosure.

FIG. 16 depicts one embodiment of forming an epitaxial drain region 35. The epitaxial drain region depicted in FIG. 16 may be doped to an n-type conductivity. The epitaxial drain region 35 that is depicted in FIG. 16 is similar to the epitaxial drain region 30 that is depcited in FIG. 7. Therefore, the process sequence depicted in FIG. 7 provides one embodiment of a method for forming the epitaxial drain region 35 that is depicted in FIG. 16. For example, forming the epitaxial drain region 35 may include a process sequence that includes recessing the epitaxial fin structure, forming a dielectric cap 29a atop the recessed surface of the epitaxial fin structure, removing the cap dielectric layer 24 to expose sidewalls of the epitaxial fin structure; and forming the epitaxial drain region 35 on the sidewalls of the epitaxial fin structure using an epitaxial deposition process in combination with an in situ doping process.

Figure 17:
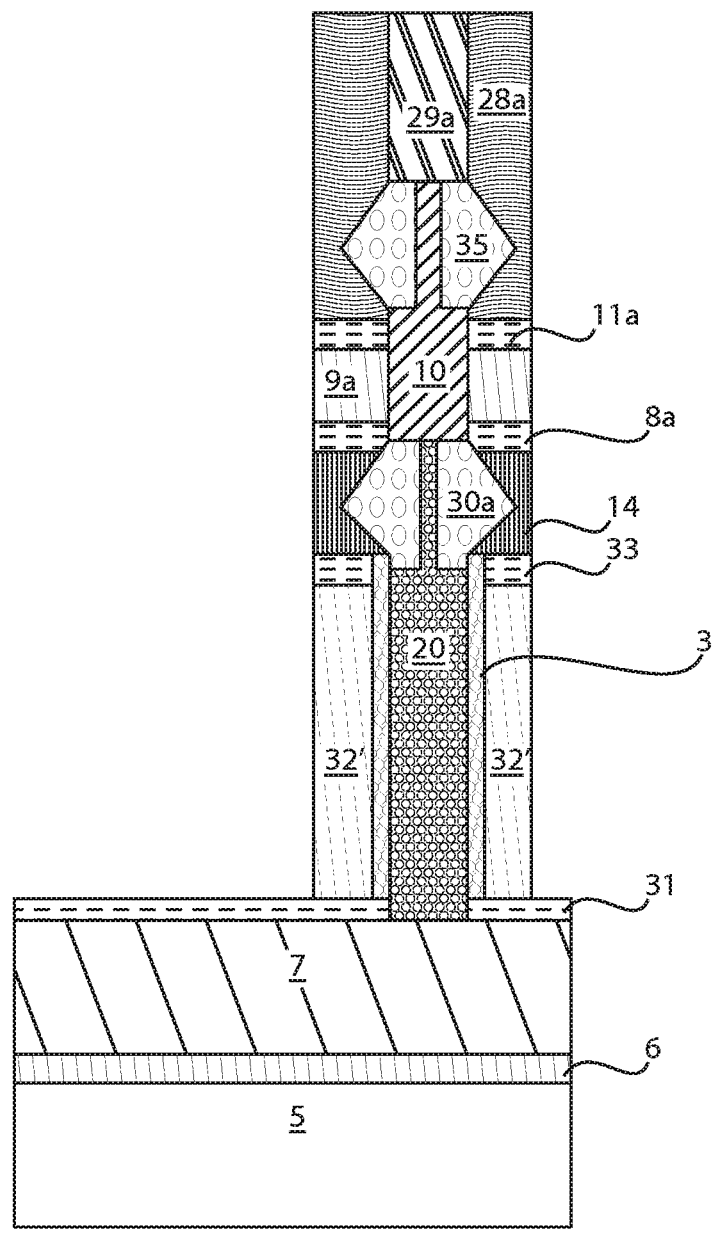
FIG. 17 is a side cross-sectional view depicting patterning the structure depicted in FIG. 16 as a step of a process flow for forming the gate structure for the MOSFET of the inverter, in accordance with one embodiment of the present disclosure.

FIG. 17 depicts patterning the structure depicted in FIG. 16 as a step of a process flow for forming the gate structure 15 for the MOSFET of the inverter, as depicted in FIGS. 10-12. The process flow for forming the gate structure 15 may begin with forming encapsulating sidewalls spacers 28a that are formed on the sidewalls of the epitaxial drain region 35. The encapsulating sidewall spacers having reference number 28a have been described above by the encapsulating sidewall spacers having reference number 28 in FIG. 8. Following the formation of the encapsulating sidewall spacers 28a, an anisotropic etch process, such as reactive ion etch (RIE), employing the encapsulating sidewall spacers 28*a* and the dielectric cap 29*a* as an etch mask, remove the exposed portions of the dielectric stack 11*a*, 9*a*, 8*a* corresponding to the body 10 of the passive resistor, removed the exposed portion of the upper gate sidewall spacer 33 and remove the exposed portions of the sacrificial gate layer 32. Due to the anisotropic nature of the aforementioned etch sequence, a remaining portion of the sacrificial gate layer 32' remains underlying the encapsulating sidewall spacers 28*a*. The remaining portion of the sacrificial gate layer 32' and the dielectric surface 3 on the channel portion 20 of the fin structure may then be removed using an isotropic etch.

Referring to FIGS. 10-12, the gate structure 15 including the gate dielectric 17, the metal work function adjusting layer 18, and the gate electrode 16 may then be formed on the channel portion 20 of the fin structure. Further details on forming the gate structure 15 have been described above in the gate structure forming sequence that is described with reference to FIGS. 1-3. Following forming the gate structure 15, an interlevel dielectric 40 is deposited followed by the formation of the gate contact 44 and the drain contact 45.

It is noted that the MOSFET devices depicted in FIGS. 1-17 are not the only vertical semiconductor devices suitable for use with the methods and structures described herein. For example, the JFET devices may also be integrated with passive resistors in inverter structures as depicted in FIGS. 18-21. A junction field effect transistor (JFET) does not include a gate dielectric layer in the gate structure of the device, which is a component of the gate structure to a metal oxide semiconductor field effect transistor (MOSFET). JFETs are voltage-controlled in that they do not need a biasing current. Electric charge flows through a semiconducting channel between source and drain terminals. By applying a reverse bias voltage to a gate terminal, the channel is "pinched", so that the electric current is impeded or switched off completely. A JFET is usually on when there is no potential difference between its gate and source terminals. If a potential difference of the proper polarity is applied between its gate and source terminals, the JFET will be more resistive to current flow, which means less current would flow in the channel between the source and drain terminals. Thus, JFETs are sometimes referred to as depletion-mode devices.

FIGS. 18 and 19 depict one embodiment of an inverter including a passive electrical device, e.g., a passive resistor, integrated with a junction field effect transistor (JFET) having a vertical orientation, in which the body 10 of the passive resistor is positioned between the channel 20 of the vertically orientated JFET and a supporting substrate 5. The inverter depicted in FIGS. 18 and 19 is similar to the inverter depicted in FIGS. 1-3 with the exception that a gate structure to the JFET device does not include a gate dielectric, and the gate structure to the MOSFET device does include a gate dielectric.

Therefore, the structures having reference numbers in FIGS. 18 and 19 that have the same reference numbers as structures depicted in FIGS. 1-3 are equivalent to those same designated structures. Therefore, the description of the structures in FIGS. 1-9 having the same references numbers as the structures labeled in FIGS. 18 and 19 provide one embodiment of the description of the structures depicted in FIGS. 18 and 19.

The gate structure of the JFET device depicted in FIGS. 18 and 19 may include an epitaxially formed doped semiconductor, as depicted by reference number 70. The JFET gate structure 70 may be composed of silicon (Si), but other type IV and/or type III-IV semiconductor materials may be equally applicable for the JFET gate structure 70. In some examples, the JFET gate structure 70 is doped to an n-type conductivity.

It is noted that the inverters depicted in FIGS. 18 and 19 can be formed using a method similar to the method described with reference to FIGS. 1-9 with the exception of the description of forming the gate structure. Instead of forming a gate structure including a gate dielectric 17, work function adjusting layer 18 and a gate electrode 16, the gate structure for the JFET is an epitaxial semiconductor that is epitaxially formed and insitu doped, e.g., n-type doped, on the exposed channel region 20 of the semiconductor fin structure.

Figure 21:
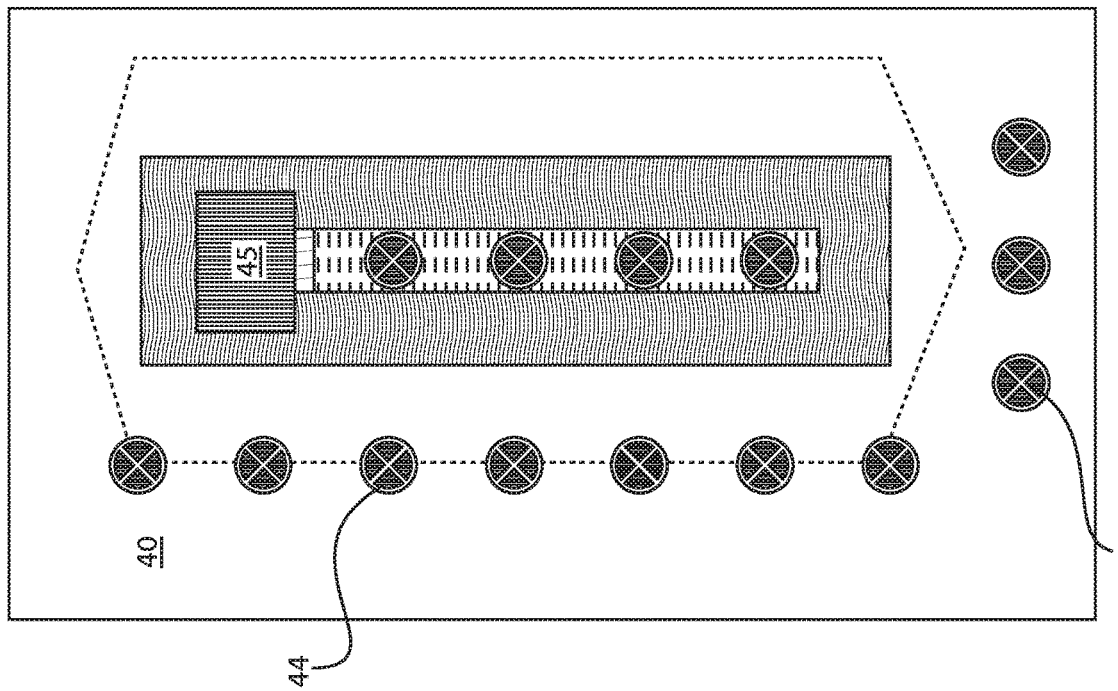
FIG. 21 is a top down view of the structure depicted in FIG. 20.
Figure 20:
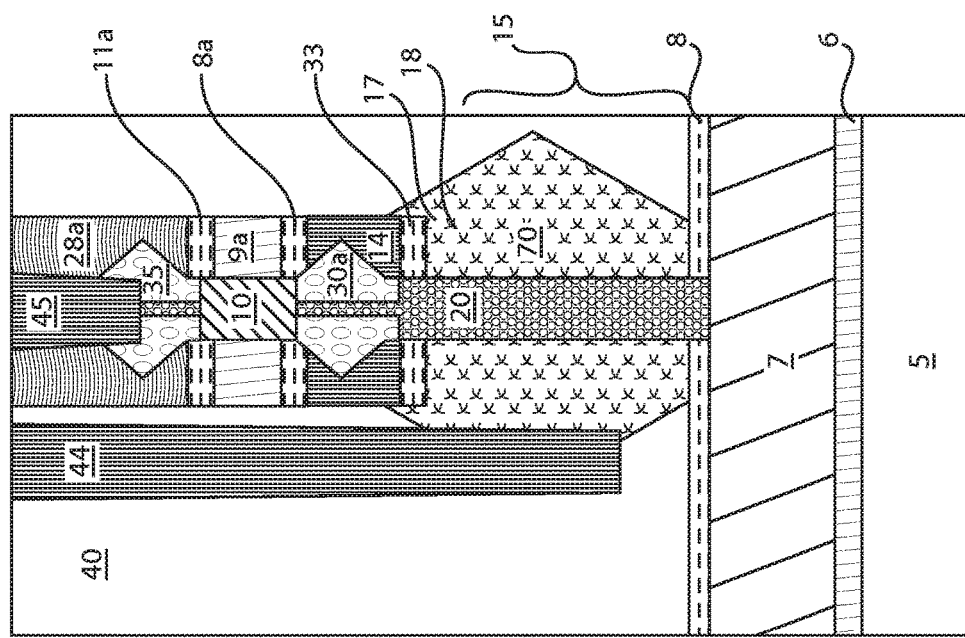
FIG. 20 is a side cross-sectional view depicting one embodiment of an inverter including a passive electrical device, e.g., a passive resistor, integrated with a junction field effect transistor (JFET) having a vertical orientation, in which the body of the passive resistor is positioned atop the channel region of the vertically orientated JFET, in accordance with the present disclosure.

FIGS. 20 and 21 depict one embodiment of an inverter including a passive electrical device, e.g., a passive resistor, integrated with a junction field effect transistor (JFET) having a vertical orientation, in which the body 10 of the passive resistor is positioned atop the channel region 20 of the vertically orientated JFET, the channel region 20 of the vertically orientated JFET is positioned between the body 10 of the passive resistor and a supporting substrate 5.

The inverter depicted in FIGS. 20 and 21 is similar to the inverter depicted in FIGS. 10-12 with the exception that a gate structure to the JFET device does not include a gate dielectric, and the gate structure to the MOSFET device does include a gate dielectric. Therefore, the structures having reference numbers in FIGS. 20 and 21 that have the same reference numbers as structures depicted in FIGS. 10-12 are equivalent to those same designated structures. Therefore, the description of the structures in FIGS. 10-17 having the same references numbers as the structures labeled in FIGS. 20 and 21 provide one embodiment of the description of the structures depicted in FIGS. 20 and 21.

The gate structure of the JFET device depicted in FIGS. 20 and 21 may include an epitaxially formed doped semiconductor, as depicted by reference number 70. The JFET gate structure 70 may be composed of silicon (Si), but other type IV and/or type III-IV semiconductor materials may be equally applicable for the JFET gate structure 70. In some examples, the JFET gate structure 70 is doped to an n-type conductivity.

It is noted that the inverters depicted in FIGS. 20 and 21 can be formed using a method similar to the method described with reference to FIGS. 10-17 with the exception of the description of forming the gate structure. Instead of forming a gate structure including a gate dielectric 17, work function adjusting layer 18 and a gate electrode 16, the gate structure for the JFET is an epitaxial semiconductor that is epitaxially formed and insitu doped, e.g., n-type doped, on the exposed channel region 20 of the semiconductor fin structure.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An inverter comprising:
   a fin structure vertically orientated on a supporting substrate, the fin structure including both a resistive portion and a semiconductor portion monolithically integrated into a same fin structure that provides the fin structure vertically orientated on the supporting substrate;

a transistor comprising a channel region present in the semiconductor portion of the fin structure and a gate all around (GAA) gate structure present on the channel region, wherein the gate all around gate structure comprises a gate dielectric directly on the channel region of the semiconductor portion of the fin structure and a gate electrode directly on the gate dielectric; and a passive resistor provided in the resistive portion of the fin structure positioned between the supporting substrate and the semiconductor portion of the fin structure and present on an electrically conductive material layer, wherein the channel region of the transistor and the passive resistor in the resistive portion of the fin structure are integrated into the same fin structure, an end of a source/drain region at an end of the channel region of the transistor being in direct contact with the passive resistor, wherein a width of a body portion of the passive resistor is not greater than a width of the channel region of the transistor, wherein the transistor includes a first source/drain region provided by a doped semiconductor layer present on the supporting substrate, and a second source/drain region is present at an end of the semiconductor portion of the fin structure opposite the first source/drain region, wherein the passive resistor is in direct contact with the second source/drain region of the semiconductor portion of the fin structure, wherein the second source/drain region is laterally surrounded by and electrically connected to a metal line.

2. The inverter of claim 1, wherein the second source/drain region comprise epitaxial semiconductor material formed on sidewalls of the semiconductor portion of the fin structure.

3. The inverter of claim 1, wherein the resistive portion of the fin structure that provides the passive resistor is comprised of epitaxial semiconductor material doped to have a higher resistivity than the semiconductor portion of the fin structure.

4. The inverter of claim 1, wherein the resistive portion of the fin structure is a base structure of the fin structure in epitaxial relationship with the supporting substrate.

5. The inverter of claim 1, wherein passive resistor is surrounded by dielectric.

6. The inverter of claim 1, wherein the resistive portion is present between the semiconductor portion and the supporting substrate.

* * * * *